(12) United States Patent  
Chou et al.

(10) Patent No.: US 11,444,170 B1
(45) Date of Patent: Sep. 13, 2022

(54) SEMICONDUCTOR DEVICE WITH BACKSIDE SELF-ALIGNED POWER RAIL AND METHODS OF FORMING THE SAME

(71) Applicant: Taiwan Semiconductor Manufacturing Co., Ltd., Hsinchu (TW)

(72) Inventors: Chih-Chao Chou, Hsinchu (TW); Kuo-Cheng Chiang, Hsinchu County (TW); Shi Ning Ju, Hsinchu (TW); Wen-Ting Lan, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/199,629

(22) Filed: Mar. 12, 2021

(51) Int. Cl.
*H01L 29/423* (2006.01)
*H01L 29/66* (2006.01)
*H01L 29/08* (2006.01)
*H01L 29/10* (2006.01)

(52) U.S. Cl.
CPC .... *H01L 29/42392* (2013.01); *H01L 29/0847* (2013.01); *H01L 29/1033* (2013.01); *H01L 29/66545* (2013.01)

(58) Field of Classification Search
CPC ........... H01L 29/42392; H01L 29/0653; H01L 29/78696; H01L 2029/7858; H01L 29/66545
See application file for complete search history.

(56) References Cited

U.S. PATENT DOCUMENTS

| | | | |
|---|---|---|---|
| 9,818,872 B2 | 11/2017 | Ching et al. | |
| 9,887,269 B2 | 2/2018 | Ching et al. | |
| 9,899,398 B1 | 2/2018 | Colinge et al. | |
| 10,032,627 B2 | 7/2018 | Lee et al. | |
| 10,109,721 B2 | 10/2018 | Lin et al. | |
| 10,157,799 B2 | 12/2018 | Ching et al. | |
| 10,199,502 B2 | 2/2019 | Huang et al. | |
| 10,290,546 B2 | 5/2019 | Chiang et al. | |
| 10,475,902 B2 | 11/2019 | Lee et al. | |
| 10,833,078 B2 * | 11/2020 | Smith | H01L 27/124 |
| 2018/0175036 A1 | 6/2018 | Ching et al. | |
| 2020/0098681 A1 * | 3/2020 | Kim | H01L 21/823821 |

* cited by examiner

*Primary Examiner* — Changhyun Yi
(74) *Attorney, Agent, or Firm* — Haynes and Boone, LLP

(57) ABSTRACT

Semiconductor device and the manufacturing method thereof are disclosed. An exemplary semiconductor device comprises a dielectric layer formed over a conductive feature; a semiconductor stack formed over the dielectric layer, wherein the semiconductor stack including semiconductor layers stacked up and separated from each other; a first metal gate structure and a second metal gate structure formed over a channel region of the semiconductor stack, wherein the first metal gate structure and the second metal gate structure wrap each of the semiconductor layers of the semiconductor stack; and a first epitaxial feature disposed between the first metal gate structure and the second metal gate structure over a first source/drain region of the semiconductor stack, wherein the first epitaxial feature extends through the dielectric layer and contacts the conductive feature.

20 Claims, 22 Drawing Sheets

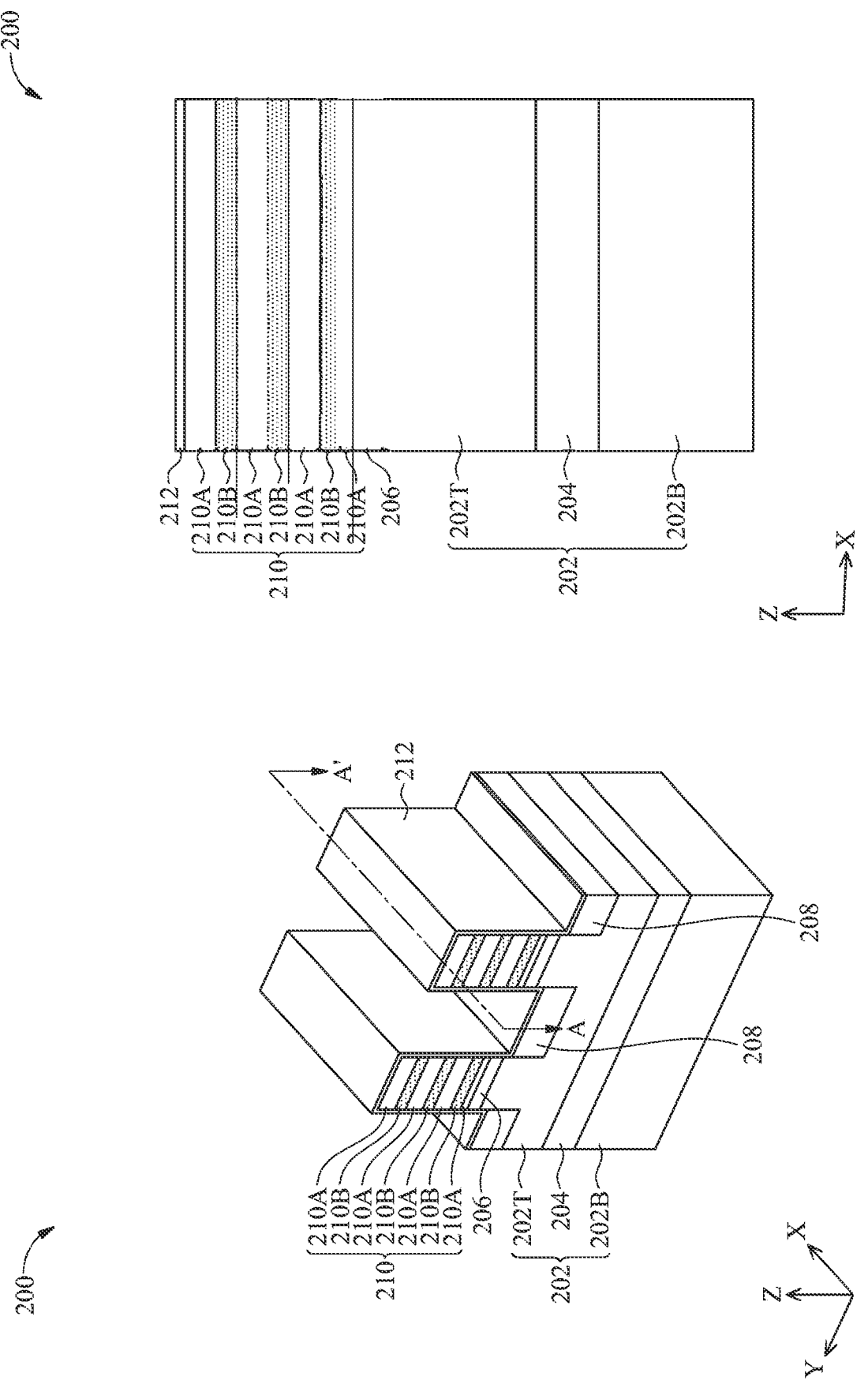

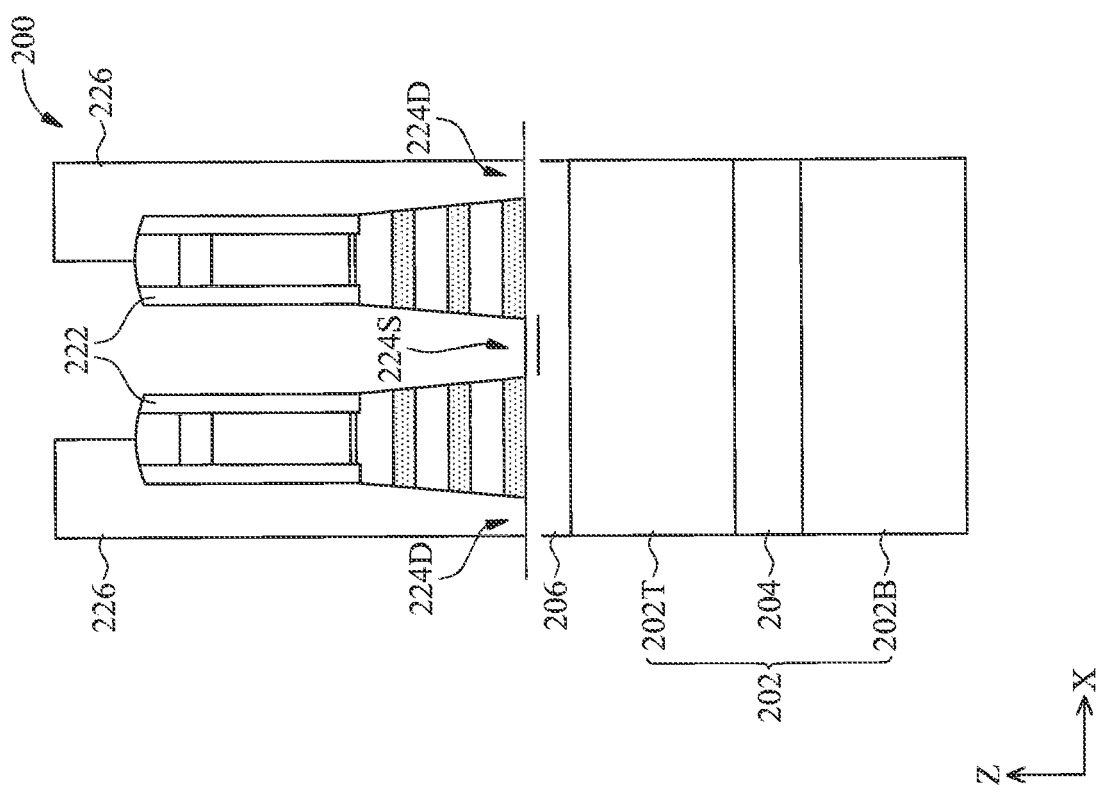
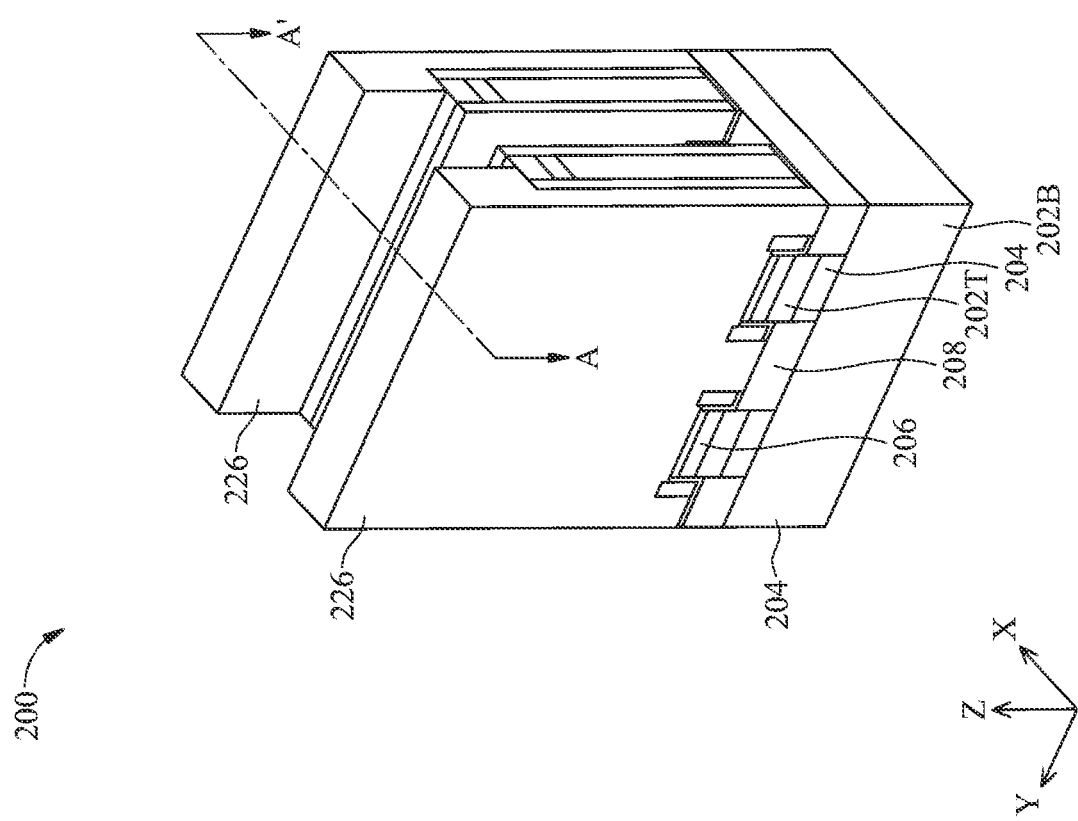
FIG. 5A
FIG. 5B

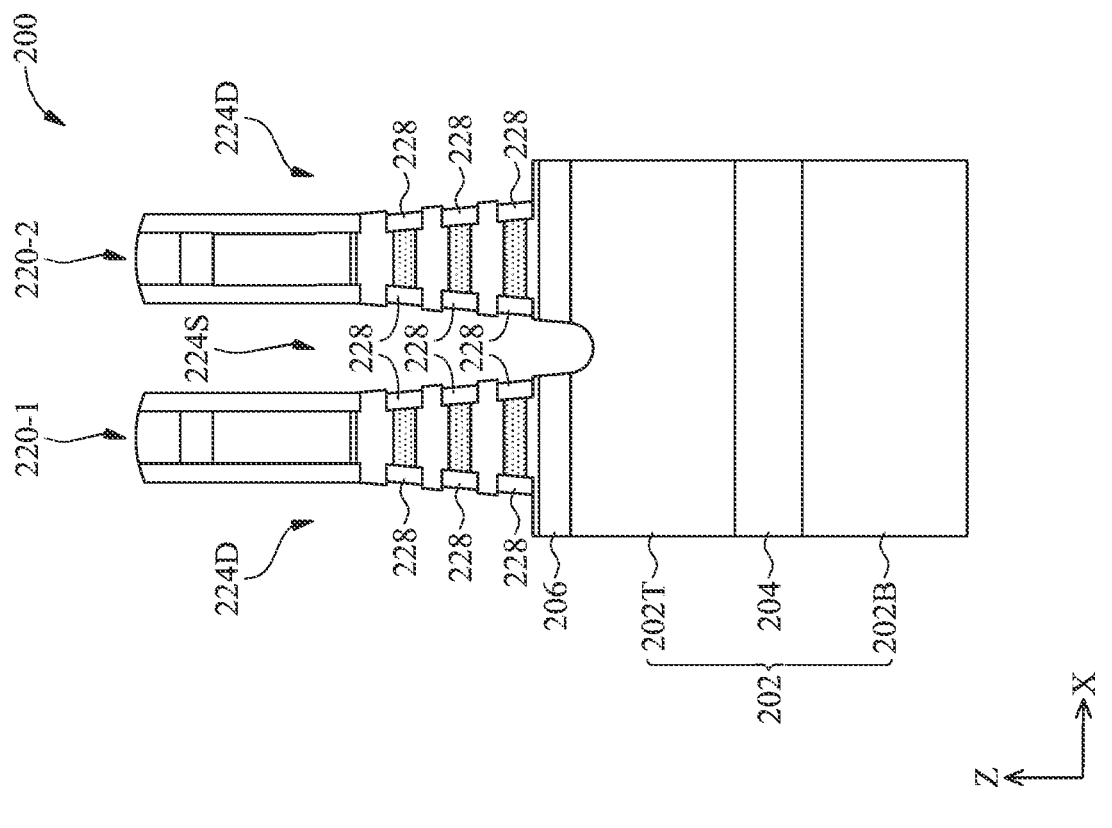
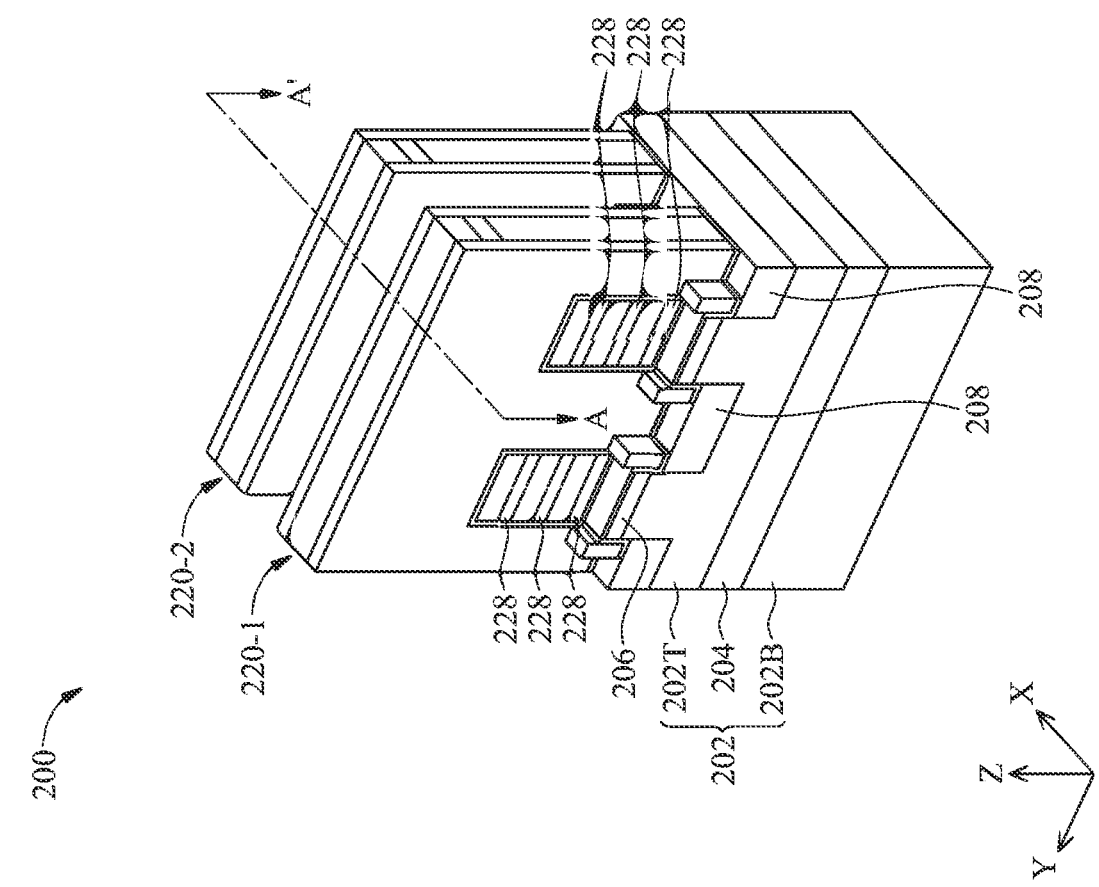
FIG. 8A
FIG. 8B

SEMICONDUCTOR DEVICE WITH BACKSIDE SELF-ALIGNED POWER RAIL AND METHODS OF FORMING THE SAME

BACKGROUND

The integrated circuit (IC) industry has experienced exponential growth. Multi-gate devices have been introduced to improve gate control by increasing gate-channel coupling and reducing off-state current. One such multi-gate device is a gate-all-around (GAA) device. A GAA device generally refers to any device having a gate structure, or portions thereof, formed on more than one side of a channel region (for example, surrounding a portion of the channel region). GAA transistors allow aggressive scaling down of transistors. However, such scaling down has also increased the complexity of processing and manufacturing ICs and, for these advances to be realized, similar developments in IC processing and manufacturing are needed. For example, along with the scaling down of the device sizes, power lines (also referred to as power rails) are formed on the backside of the substrate. However, the existing power rail schemes face various challenges. For example, due to the process limitations, the existing power rail schemes has low density and high resistance, the isolation between the metal gate and the power line are very challenged, and the short issue from the source region to the drain region may also occurs. Therefore, the performance of the semiconductor is degraded, and improvements are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-22A illustrate three-dimensional perspective views of the example semiconductor device at intermediate stages of the method of FIG. 1 in accordance with some embodiments of the present disclosure.

FIGS. 2B-22B illustrate cross-sectional views of the semiconductor device along line A-A' in the corresponding three-dimensional perspective views of the example semiconductor device at intermediate stages of the method of FIG. 1 in accordance with some embodiments of the present disclosure.

DETAILED DESCRIPTION

Figure 1:
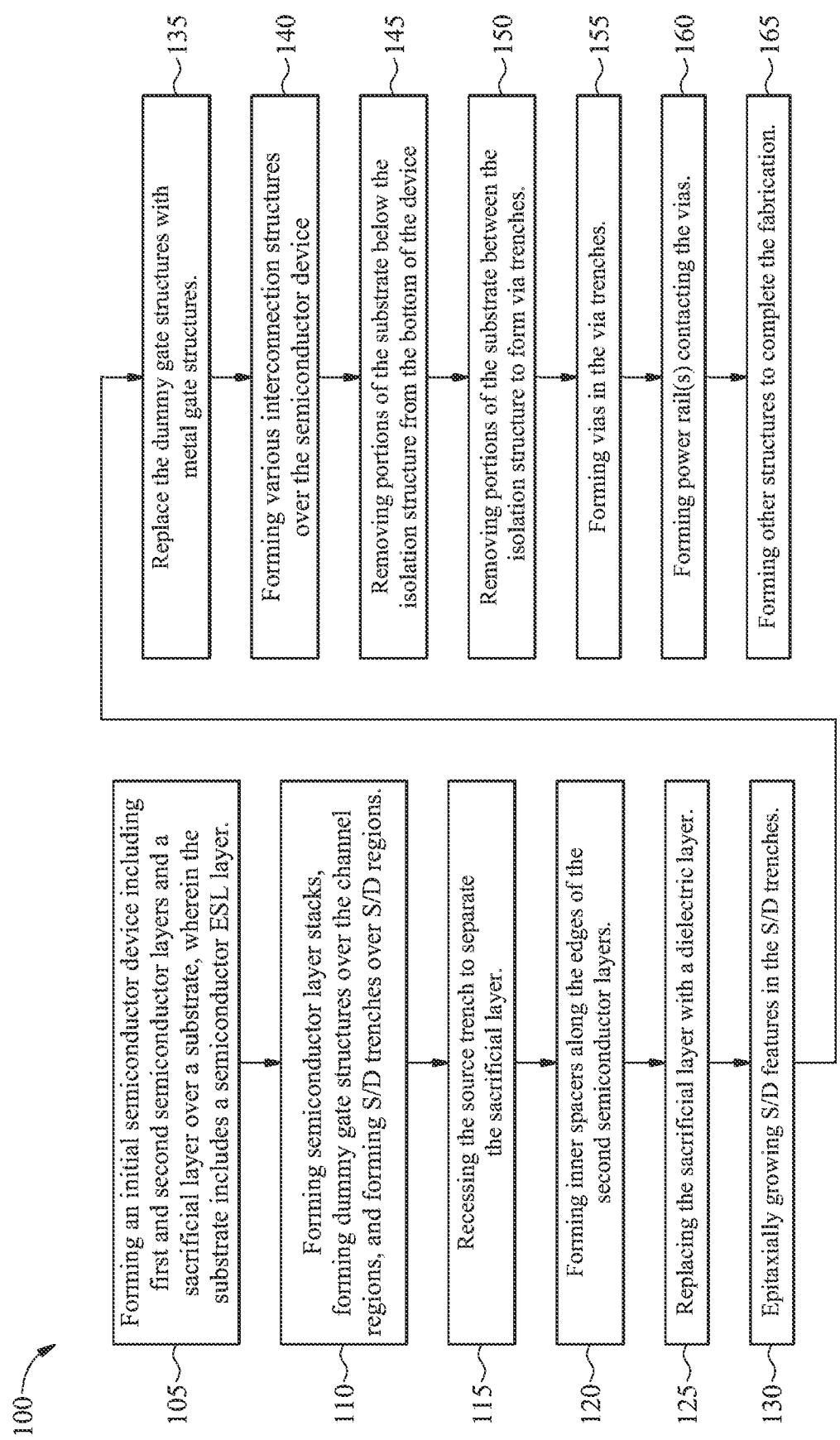
FIG. 1 illustrates a flowchart of an example method for making an example semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may comprise embodiments in which the first and second features are formed in direct contact, and may also comprise embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may comprise embodiments in which the features are formed in direct contact, and may also comprise embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating field-effect transistors (FETs), such as gate-all-around FETs (GAA FETs).

In a GAA device, a channel region of a single device may comprise multiple layers of semiconductor material physically separated from one another. In some examples, a gate of the device is disposed above, alongside, and even between the semiconductor layers of the device. However, in a conventional GAA device, the power rail is disposed on the front side of the substrate (above the top surface of the substrate), the device performance is degraded due to the lower gate density and the higher resistance. Moving power rail from front side to backside is area benefited for GAA device. It can increase the metal line track number and improve the gate density. It can also increase the power rail width to lower the resistance. However, due to the process limitation and fabrication constraint, in a backside power rail scheme, overlay shifting between the via and the source/ drain (S/D) feature is difficult to control which may cause short circuit between the metal gate and the power rail, and short circuit between source and drain regions.

The present disclosure provides a GAA device with a self-aligned backside power rail scheme. A bottom dielectric layer is applied to control the self-aligned via position. Thus, the via is controlled to only connect to the source region(s), thereby to mitigate the short circuit issues between the metal gate and the power rail, or between the source and the drain regions. Therefore, the reliability and the performance of the semiconductor device can be improved.

FIG. 1 illustrates a flow chart of a method 100 for making an example semiconductor device 200 (hereinafter, device 200) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various three-dimensional and cross-sectional views of the device 200 during intermediate steps of method 100. In particular, FIGS. 2A-22A illustrate three-dimensional views of the device 200 at intermediate stages of the method 100 in accordance with some embodiments of the present disclosure. FIGS. 2B-22B illustrate cross-sectional views of the device 200 taken along the plane A-A' shown in the corresponding three-dimensional views (that is, in an X-Z plane) at intermediate stages of the method 100 in accordance with some embodiments of the present disclosure.

Device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an integrated circuit (IC). In some embodiments, device 200 may be a portion of an IC chip, a system on chip (SoC), or portion thereof. The present disclosure is not limited to any particular number of devices or device regions, or to any particular device configurations. For example, though device 200 as illustrated is a three-dimensional GAA device, the present disclosure may also provide embodiments for fabricating fin-like FETs (FinFETs) or planar FET devices.

Figure 2B:
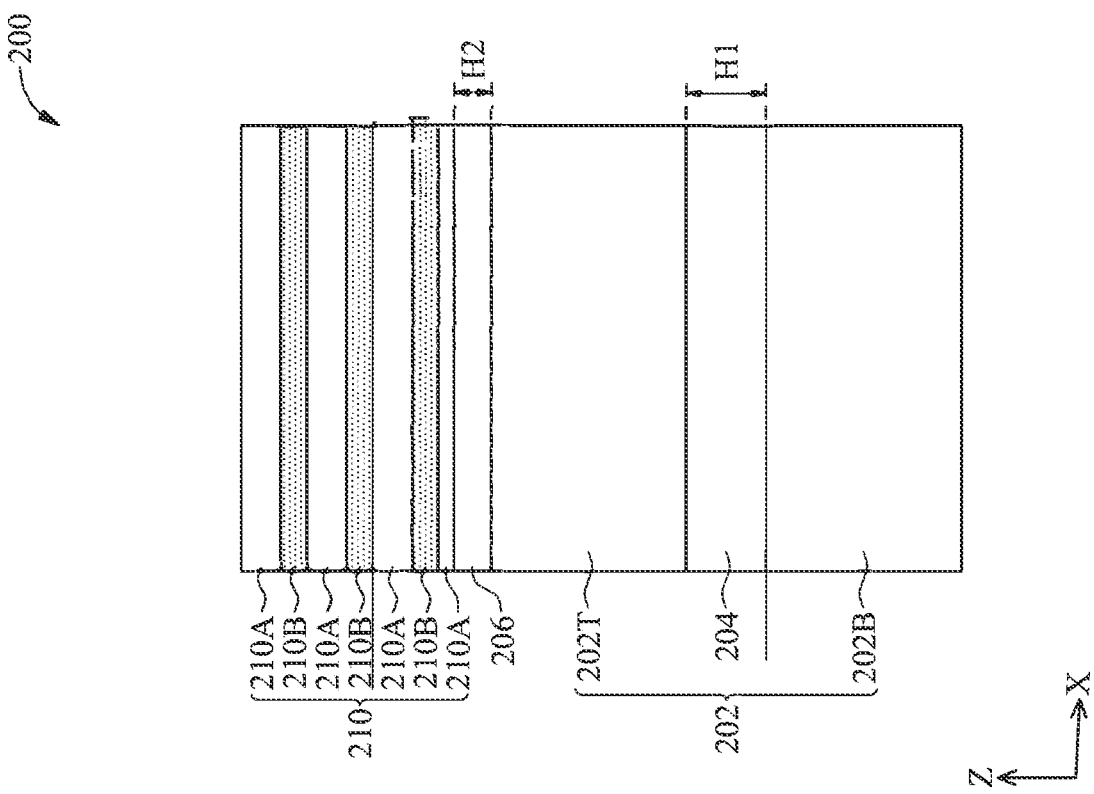
Figure 2A:
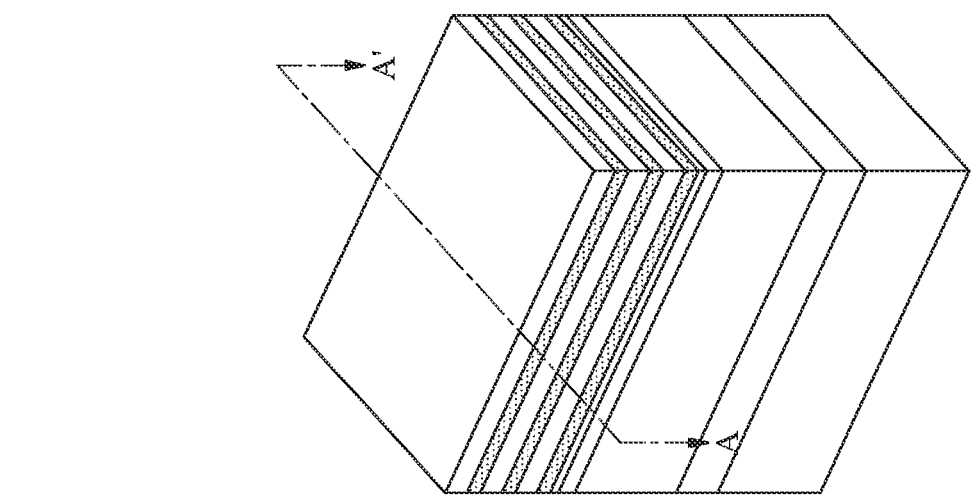

Referring to FIGS. 1, 2A and 2B, at operation 105, an initial semiconductor structure of device 200 is formed. As depicted in FIGS. 2A and 2B, device 200 comprises a substrate 202. In the depicted embodiment, the substrate 202 is a bulk silicon substrate. Alternatively or additionally, the substrate 202 includes another single crystalline semiconductor, such as germanium; a compound semiconductor; an alloy semiconductor; or combinations thereof. Alternatively, the substrate 202 is a semiconductor-on-insulator substrate, such as a silicon-on-insulator (SOI) substrate, a silicon germanium-on-insulator (SGOI) substrate, or a germanium-on-insulator (GOI) substrate. The substrate 202 may be doped with different dopants to form various doped regions therein. For example, the substrate 202 may include PFET region comprising n-type doped substrate regions (such as n-well) and NFET region comprising p-type doped substrate regions (such as p-well).

The device 200 includes alternating semiconductor layers formed over the substrate 202, such as semiconductor layers 210A including a first semiconductor material and semiconductor layers 210B including a second semiconductor material that is different from the first semiconductor material. The different semiconductor materials of the semiconductor layers 210A and 210B have different oxidation rates and/or different etch selectivity. In some embodiments, the first semiconductor material of the semiconductor layers 210A is the same as the substrate 202. For example, the semiconductor layers 210A comprise silicon (Si, like the substrate 202), and the semiconductor layers 210B comprise silicon germanium (SiGe). Thus, alternating Si/SiGe/Si/SiGe/Si/ . . . layers are arranged from bottom to top. In some embodiments, the material of the top semiconductor layer may or may not be the same as the bottom semiconductor layer. In some embodiments, the semiconductor layers 210A may be undoped or substantially dopant-free. In other words, no intentional doping is performed when forming the semiconductor layers 210A. In some other embodiments, the semiconductor layers 210A may be doped with a p-type dopant or an n-type dopant. The number of the semiconductor layers 210A and 210B depends on the design requirements of device 200. For example, it may comprise one to ten layers of semiconductor layers 210A or 210B each. In some embodiments, different semiconductor layers 210A and 210B have the same thickness in the Z-direction. In some other embodiments, different semiconductor layers 210A and 210B have different thicknesses. In some embodiments, the semiconductor layers 210A and/or 210B are formed by suitable epitaxy process. For example, semiconductor layers comprising SiGe and Si are formed alternately over the substrate 202 by a molecular beam epitaxy (MBE) process, a chemical vapor deposition (CVD) process, such as a metal organic CVD (MOCVD) process, and/or other suitable epitaxial growth processes.

Referring to FIGS. 2A and 2B, a semiconductor layer 204 is formed in the substrate 202 and separating the substrate 202 into a top portion 202T and a bottom portion 202B. The semiconductor layer 204 will serve as an etch stop layer (ESL) when removing the substrate 202 to form the power rail on the backside, and thus a material of the semiconductor layer 204 is different from that of the substrate 202 and can provide a different oxidation rate and/or etching selectivity than the substrate 202. In some embodiment, the semiconductor layer 204 comprises a semiconductor material including silicon (Si), germanium (Ge), silicon germanium (SiGe), other semiconductor material, or combinations thereof. For example, in the depicted embodiment, the material of the semiconductor layer 204 is SiGe with a Ge concentration of more than about 15%. In some embodiments, the semiconductor layer 204 is formed by an implantation process. For example, the substrate 202 is a silicon substrate, germanium ions are implanted into the substrate 202 with a desired dose and energy to be located beneath a surface silicon layer in the substrate 202, such that the semiconductor layer 204 including SiGe is formed between the top portion 202T and the bottom portion 202B of the substrate 202. In some embodiments, the implantation is performed before or after the formation of the alternating semiconductor layers 210A and 210B. As depicted in FIG. 2B, in some embodiments, the semiconductor layer 204 has a thickness H1 of about 10 nm to about 50 nm, such that it can effectively work as an ESL while not taking too much space in the substrate 202. In the following description, the semiconductor layer 204 is considered as a portion of the substrate 202.

A sacrificial layer 206 is formed between the substrate 202 and the lowermost semiconductor layer 210A. The sacrificial layer 206 is going to be removed during the S/D trench formation and will be replaced by a bottom dielectric layer 230 (FIGS. 10A and 10B) serving the self-align function. Thus, a material of the sacrificial layer 206 is different from the substrate 202 and the semiconductor layers 210A and 210B to provide different oxidation rates and/or etching selectivity in the later etching processes. In some embodiment, the sacrificial layer 206 comprises a semiconductor material including silicon (Si), germanium (Ge), silicon germanium (SiGe), other semiconductor material, or combinations thereof. In the depicted embodiment, the material of the sacrificial layer 206 is also SiGe but with a lower Ge concentration than the SiGe material of the semiconductor layers 210B. In some embodiments, a Ge concentration of the sacrificial layer 206 is about 10% to about 35%, while a Ge concentration of the semiconductor layers 210B is about 20% to about 50%. In some embodiment, the sacrificial layer 206 is also formed by an implantation process, similar as the implantation process to form the semiconductor layer 204. The sacrificial layer 206 may be formed before or after the formation of the alternating semiconductor layers 210A and 210B and/or the semiconductor layer 204. As depicted in FIG. 2B, in some embodiments, the sacrificial layer 206 has a thickness H2 of about 6 nm to about 20 nm, such that the later formed bottom dielectric layer 230 has the thickness of about 6 nm to about 20 nm which can provide the effective self-align function.

Now referring to FIGS. 1, 3A, 3B, 4A and 4B, at operation 110, the alternating semiconductor layers 210A and 210B are patterned to form semiconductor stacks 210 (hereinafter the stacks 210), and dummy gate structures 220 are formed over the stacks 210. Referring to FIGS. 3A and 3B, a photoresist and an etching process may be performed to the semiconductor layers 210A and 210B to form the stacks 210 in fin-shapes as illustrated. For example, first, a patterned photoresist mask is formed over the semiconductor device. The patterned photoresist mask exposes the fin positions according to the design requirement of device 200. Subsequently, one or more etching processes are performed using the patterned photoresist mask to form the stacks 210. The etching process includes dry etching, wet etching, other suitable etching process, or combinations thereof. In the depicted embodiment, the one or more etching processes remove, along the patterned photoresist mask, the semiconductor layers 210A, 210B, as well as the sacrificial layer 206 and a part of the top portion 202T of the substrate 202 to form trenches between the fin-shape stacks 210.

Thereafter, still referring to FIGS. 3A and 3B, an isolation structure 208 is formed in the trenches between the stacks 210 to separate and isolate the active regions of device 200. In some embodiments, one or more dielectric materials, such as silicon dioxide (SiO) and/or silicon nitride (SiN), is deposited over the substrate 202 along sidewalls of the stack 210. The dielectric material may be deposited by CVD (such as plasma enhanced CVD (PECVD)), physical vapor deposition (PVD), thermal oxidation, or other techniques. Subsequently, the dielectric material is recessed (for example, by etching and/or chemical mechanical polishing (CMP)) to form the isolation structure 208. In some embodiments, a top surface of the isolation structure 208 is substantially coplanar with or below a bottom surface of the sacrificial layer 206, as depicted in FIG. 3A. Subsequently, a liner layer 212 is formed over the isolation structure 208, along the sidewalls and over the top surfaces of the stacks 210. In some embodiments, the liner layer 212 may include a dielectric material such as SiO, SiN, SiON, and/or other dielectric material. In some embodiments, the liner layer 212 is formed by ALD, CVD, PVD, other deposition process, or combinations thereof.

Figure 4B:
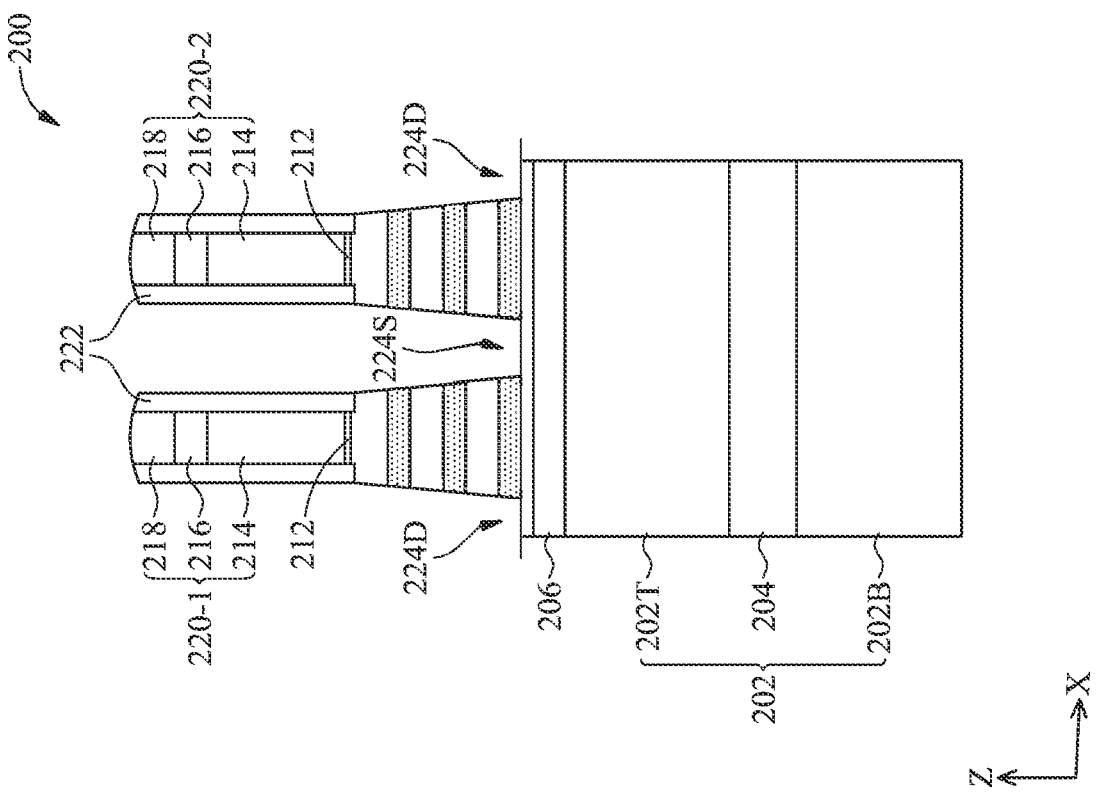
Figure 4A:
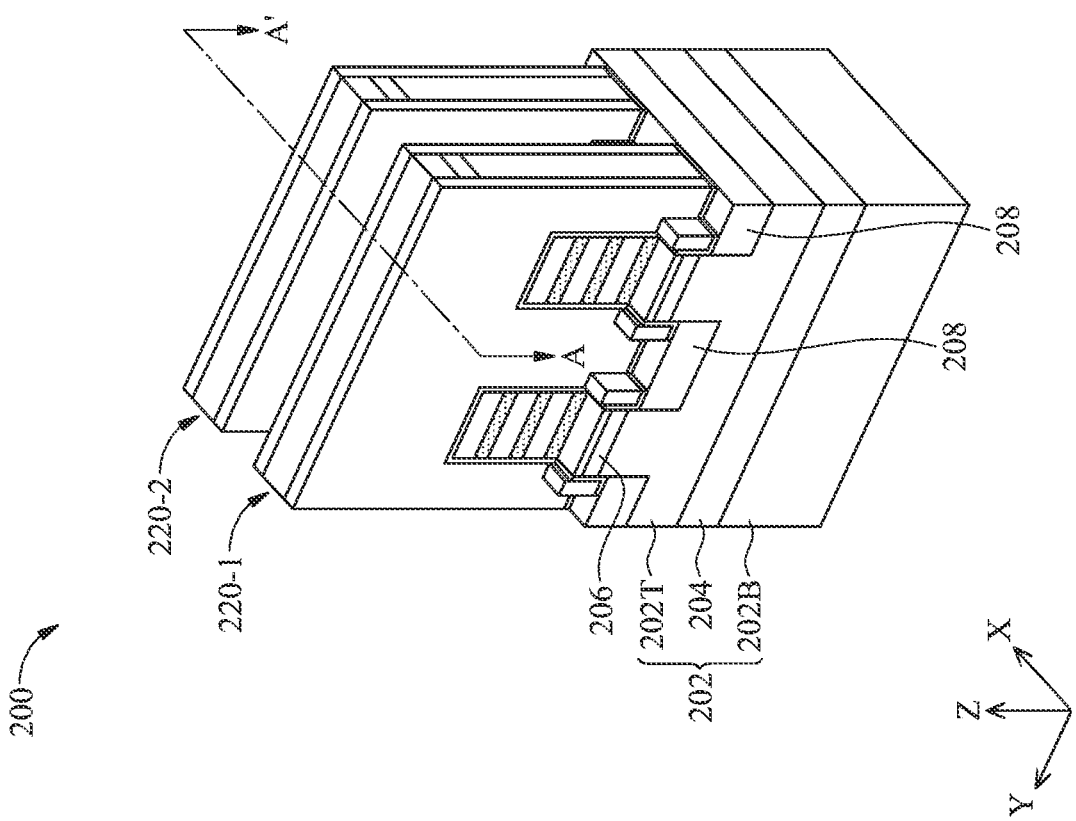

Then, referring to FIGS. 4A and 4B, dummy gate structures 220-1 and 220-2 (both referred to as dummy gate statures 220) are formed over the stacks 210. Each dummy gate structure 220 serves as a placeholder for subsequently forming a metal gate structure. In some embodiments, the dummy gate structures 220 extend along the Y-direction and traverse respective stacks 210. The dummy gate structures 220 cover the channel regions of the stacks 210 which interpose the source regions and the drain regions (both referred to as S/D regions). Each of the dummy gate structures 220 may include various dummy layers, for example, a dummy gate electrode 214 (including polysilicon), one or more hard mask layers 216 and 218 (including a dielectric material such as SiN, silicon carbonitride (SiCN), SiO, etc.), and/or other suitable layers. The dummy gate structures 220 are formed by deposition processes, lithography processes, etching processes, other suitable processes, or combinations thereof. For example, different dummy layers are deposited over the stacks 210. A lithography process is then performed to form a mask covering the channel regions of the stacks 210. Thereafter, the different dummy layers are etched using the lithography mask to form the dummy gate structures 220. And, the lithography mask is removed using any proper method.

Gate spacers 222 are formed along the sidewalls of the dummy gate structures 220 over the stack 210. In some embodiments, the gate spacers 222 comprise a dielectric material, such as SiO, SiN, silicon oxynitride (SiON), silicon carbide (SiC), other dielectric material, or a combination thereof. The gate spacers 222 are formed by any suitable process(es). For example, first, a spacer layer comprising the dielectric material is deposited (for example, by atomic layer deposition (ALD), CVD, PVD, or other proper process) over the isolation structure 208 and along sidewalls and over top surfaces of the dummy gate structures 220. Subsequently, the spacer layer is anisotropically etched to remove the portions in the X-Y plane (the plane in which the top surface of the substrate 202 is). The remaining portions of the spacer layer then become the gate spacers 222.

Thereafter, S/D regions of the stack 210 may be recessed along sidewalls of the gate spacers 222 to form S/D trenches 224S and 224D (all referred to as S/D trenches 224) in the S/D regions of the stacks 210. In the depicted embodiment, a source region is between the gate structures 220-1 and 220-2 and drains regions are along sidewalls of the dummy gate structures 220-1 and 220-2 away from each other. Thus, the source trench 224S is a source trench over the source region of the stack 210 (i.e. source trench 224S); and the drain trenches 224D are drain trenches over the drain region of the stack 210 (i.e. drain trench 224D). In some other embodiments, the region between the gate structures 220-1 and 220-2 may be a drain region, thus the trench formed therebetween is a drain trench; and the regions along sidewalls of the dummy gate structures 210-1 and 210-2 away from each other are source regions, thus the trenches formed there are sources trenches. In some embodiments, the S/D regions of the stack 210 are recessed by a S/D etching process performed along the gate spacers 222 to form the S/D trenches 224. The S/D etching process may be a dry etch (such as a reactive ion etching (RIE) process), a wet etch, or combinations thereof. The duration of the S/D etching process is controlled such that the sidewalls of each semiconductor layers 210A and 210B are exposed in the S/D trenches. In some other embodiments, the S/D etching process stops on the lowermost semiconductor layer 210A, such that the lowermost semiconductor layer 210A is not substantially etched, as depicted in FIG. 4B.

Figure 6B:
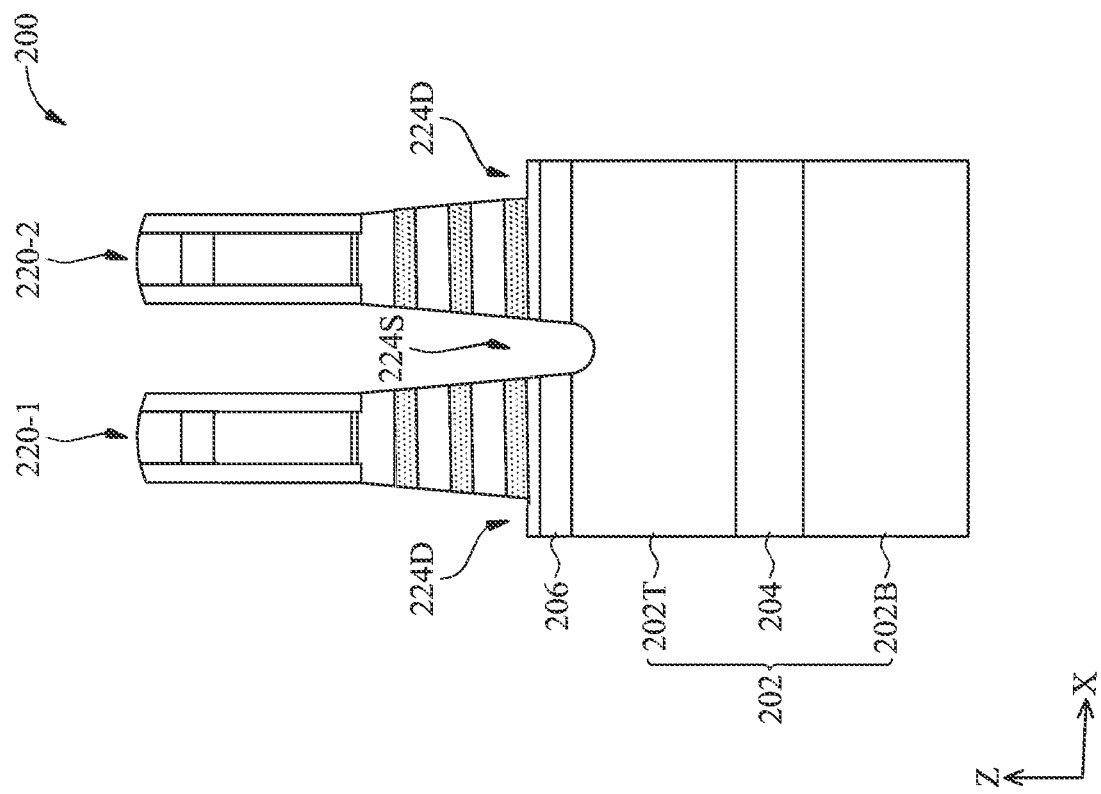
Figure 6A:
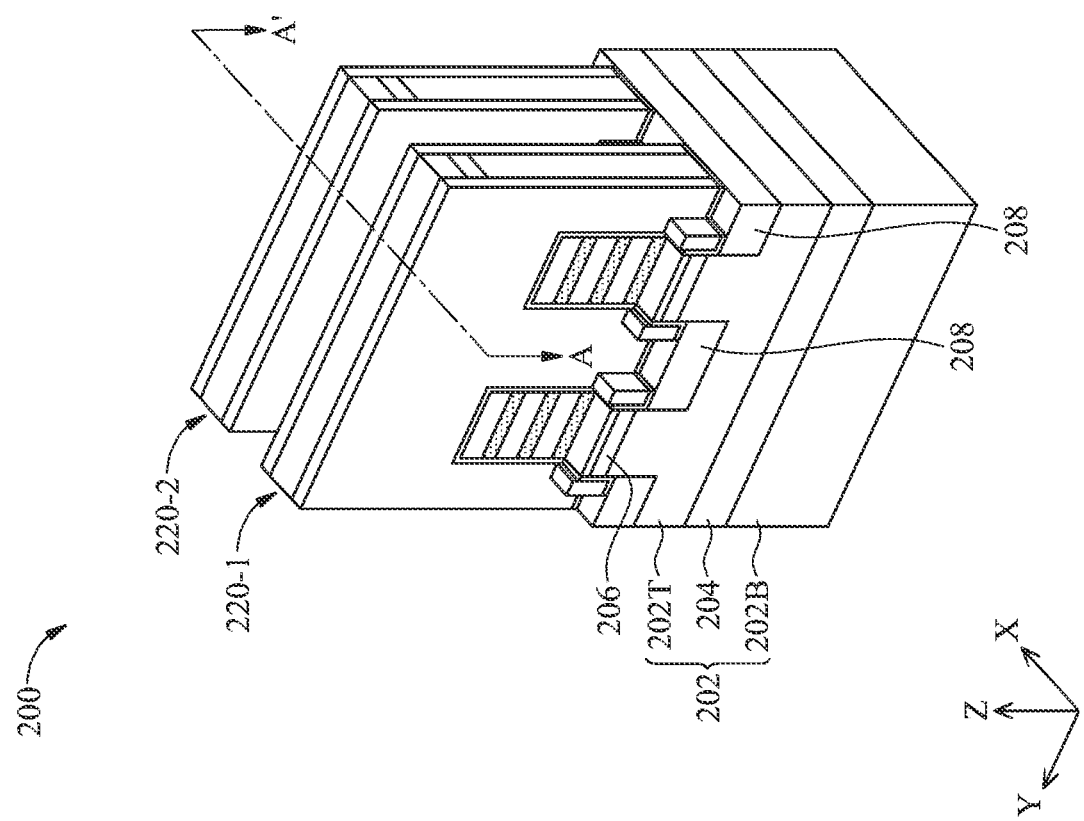

Now referring to FIGS. 1, 5A, 5B, 6A and 6B, at operation 115, the source trench 224S between the dummy gate structures 220-1 and 220-2 is further recessed, while the drain trenches 224D are substantially unaffected. Referring to FIGS. 5A and 5B, a patterned photoresist mask 226 is formed over the device 200. The patterned photoresist mask 226 expose the source trench 224S between the dummy gate structures 220-1 and 220-2 and fills in the drain trenches 224D along sidewalls of the dummy gate structures 220-1 and 220-2 away from each other. Referring to FIGS. 6A and 6B, a further S/D etching process is performed, using the patterned photoresist mask 226 as a mask, such that the source trench 224S is further recessed while the drain trenches 224D remain substantially unchanged. As depicted in FIG. 6B, a bottom surface of the source trench 224S is below a bottom surface of the sacrificial layer 206, while a bottom surface of the drain trenches 224D is above a top surface of the sacrificial layer 206. In other words, the sacrificial layer 206 is separated in the source region between the dummy gate structures 220-1 and 220-2, and sidewalls of the sacrificial layer 206 are exposed in the further recessed source trench 224S. The patterned photoresist mask 226 is then removed after the further recessing of the source trench 224S.

Figure 7B:
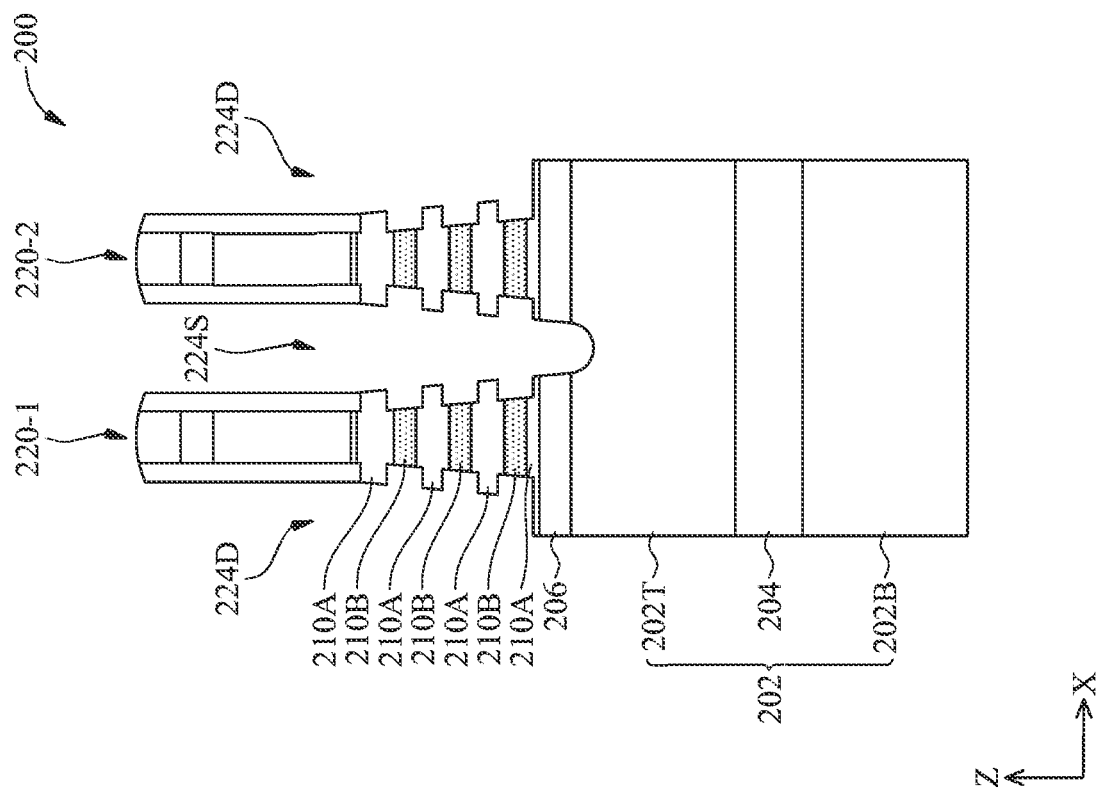
Figure 7A:
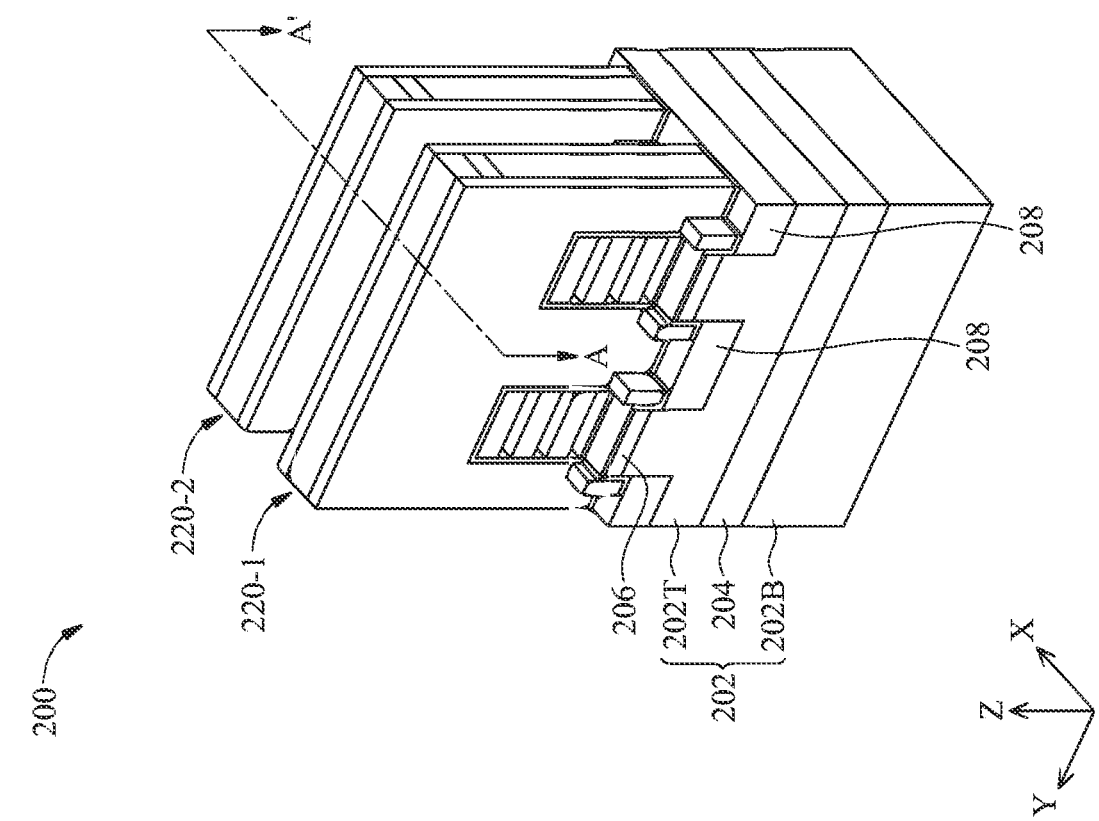

Now referring to FIGS. 1, 7A, 7B, 8A, and 8B, at operation 120, inner spacers 228 are formed between the edges of the semiconductor layers 210A. Referring to FIGS. 7A and 7B, the exposed portions (edges) of the semiconductor layers 210B in the S/D trenches 224 are selectively removed by a suitable etching process to form gaps between the semiconductor layers 210A. In other words, edges of the semiconductor layers 210A are suspended in the S/D trenches 224. Due to the different oxidation rates and/or etching selectivities of the materials of the semiconductor layers 210A (for example, Si), 210B (for example, SiGe with a higher Ge concentration), and the sacrificial layer 206 (for example, SiGe with a lower Ge concentration), only exposed portions (edges) of the semiconductor layers 210B are removed, while the semiconductor layers 210A and the sacrificial layer 206 remain substantially unchanged. In some embodiments, the selective removal of the exposed portions of the semiconductor layers 210B may include an oxidation process followed by a selective etching process. For example, the edge portions of the semiconductor layers 210B are first selectively oxidized to include a material of SiGeO. Then, a selective etching process is performed to remove the SiGeO with a suitable etchant such as ammonium hydroxide ($NH_4OH$) or hydro fluoride (HF). The duration of the oxidation process and the selective etching process can be controlled such that only edge portions of the semiconductor layers 210B are selectively removed. In some embodiments, when removing the edge portions of the semiconductor layers 210B, portions of the bottom semiconductor layers 210A exposed in the drain trenches 224D may also be removed.

Subsequently, referring to FIGS. 8A and 8B, inner spacers 228 are formed to fill in the gaps between the semiconductor layers 210A. The inner spacers 228 comprise a dielectric material that is similar to the material of the gate spacers 222, such as SiO, SiN, SiON, SiC, or combinations thereof. The dielectric material of the inner spacers may be deposited in the S/D trenches 224 and in the gaps between the edges of the semiconductor layers 210A by CVD, PVD, ALD, or combinations thereof. Extra dielectric material is then removed along sidewalls of the gate spacers 222 until the sidewalls of the semiconductor layers 210A are exposed in the S/D trenches 224.

Figure 9B:
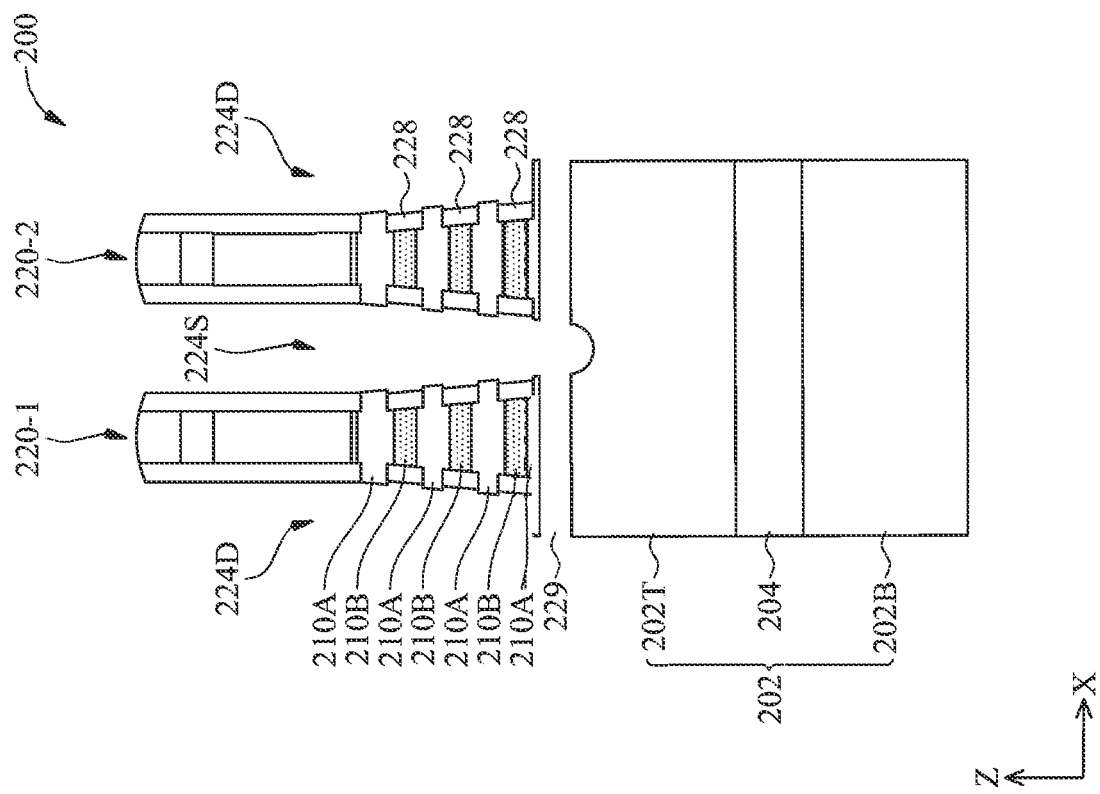
Figure 9A:
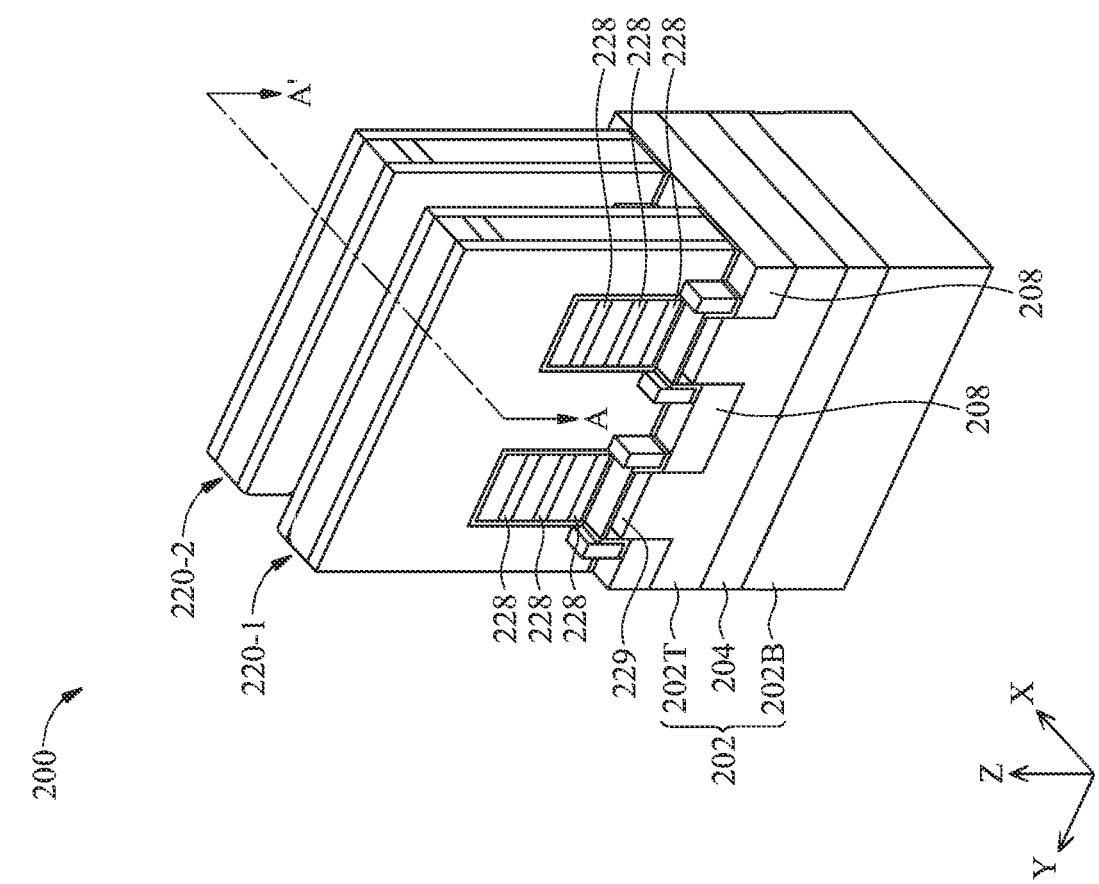

Now referring to FIGS. 1, 9A, 9B, 10A, and 10B, at operation 125, the sacrificial layer 206 is removed and replaced with a bottom dielectric layer 230. Referring to FIGS. 9A and 9B, since the sidewalls of the sacrificial layer 206 are exposed in the source trench 224S, the sacrificial layer 206 can be selectively removed from the source trench 224S. As mentioned above, the material of the sacrificial layer 206 can provide different oxidation rate and/or etching selectivity than the semiconductor layers 210A and 210B, and the semiconductor layers 210B are protected by the inner spacers 228, thus the selective removing process only removes the sacrificial layer 206 and forms a gap between the substrate 202 and the stacks 210. The selective removing process is similar as the process(es) to remove the edge portions of the semiconductor layers 210B.

Figure 10B:
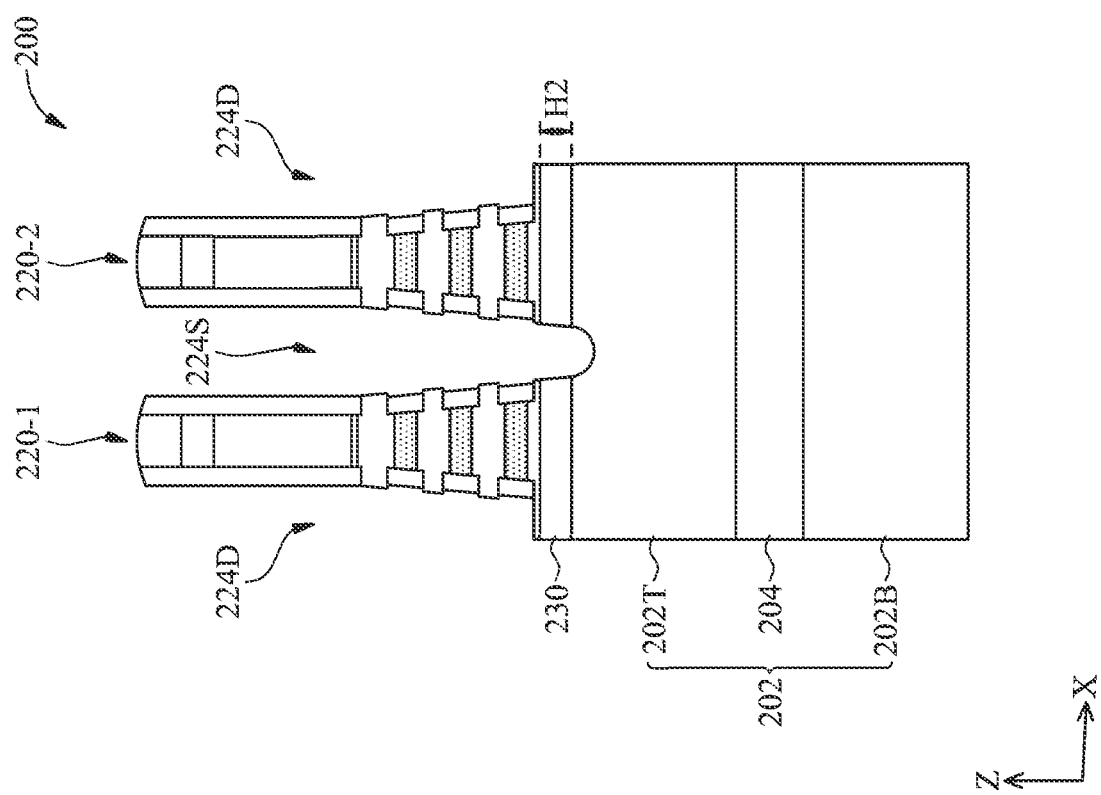
Figure 10A:
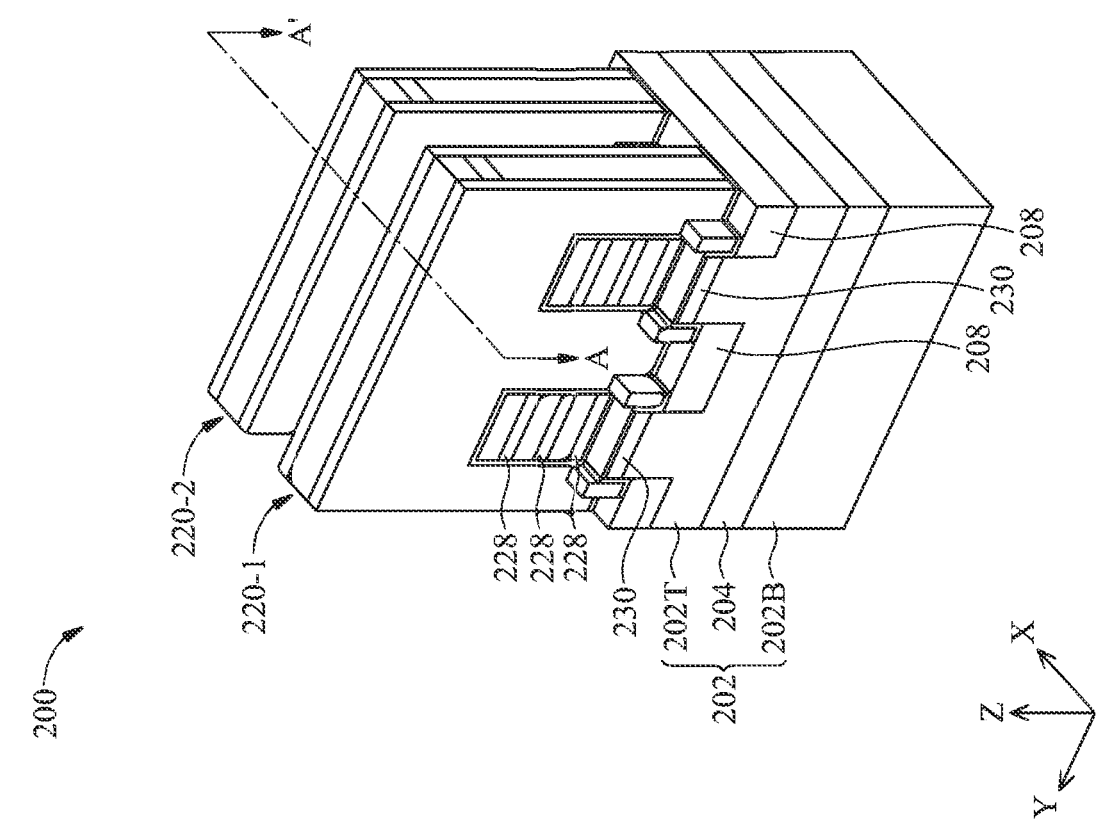
Figure 20B:
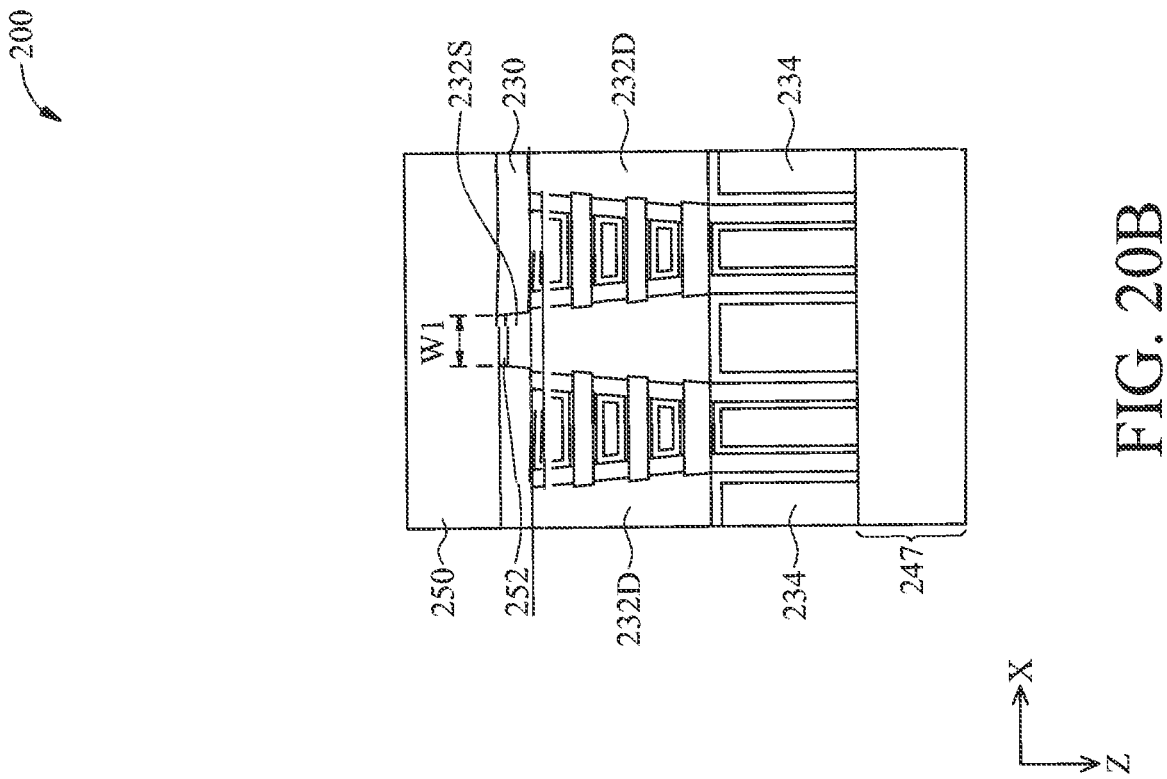

Thereafter, referring to FIGS. 10A and 10B, still at operation 125, the bottom dielectric layer 230 is formed in the gap between the substrate 202 and the stacks 210 to replace the removed sacrificial layer 206. In some embodiments, the bottom dielectric layer 230 includes a material such as SiO, SiN, SiCN, silicon oxycarbonitride (SiOCN), metal oxide, other dielectric material, or combinations thereof. In some embodiments, the dielectric material of the bottom dielectric layer 230 is first deposited, from the opening of the source trench 224S, in the gap and in the bottom portion of the source trench 224S by a suitable deposition process, for example, CVD, PVD, ALD, other deposition process, or a combination thereof. Then, an anisotropic etching is performed to remove the dielectric material in the bottom portion of the source trench 224S. The anisotropic etching includes dry etching, wet etching, or combinations thereof. The remained dielectric material after the anisotropic etching forms the bottom dielectric layer 230. As depicted in FIG. 10B, sidewalls of the bottom dielectric layer 230 are exposed in the source trench 224S. In other words, the bottom dielectric layer 230 is separated in the source region of the stacks 210, but is extended under the drain regions of the stacks 210. Therefore, the later formed epitaxial feature 232S in the source region may contact the later formed via 250 through the bottom dielectric layer 230 in a self-aligned manner (FIG. 20B). In some embodiments, a thickness of the bottom dielectric layer 230 is the same as the thickness H2 of the sacrificial layer 206, which is about 6 nm to about 20 nm.

Figure 11B:
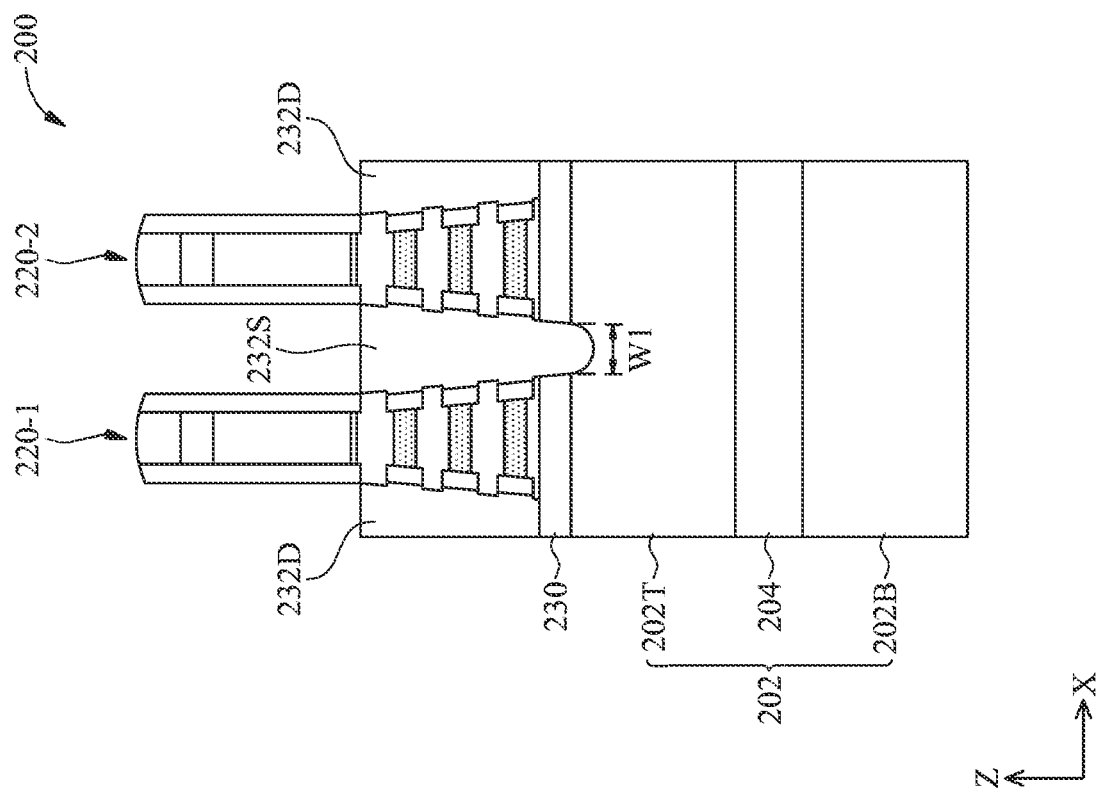
Figure 11A:
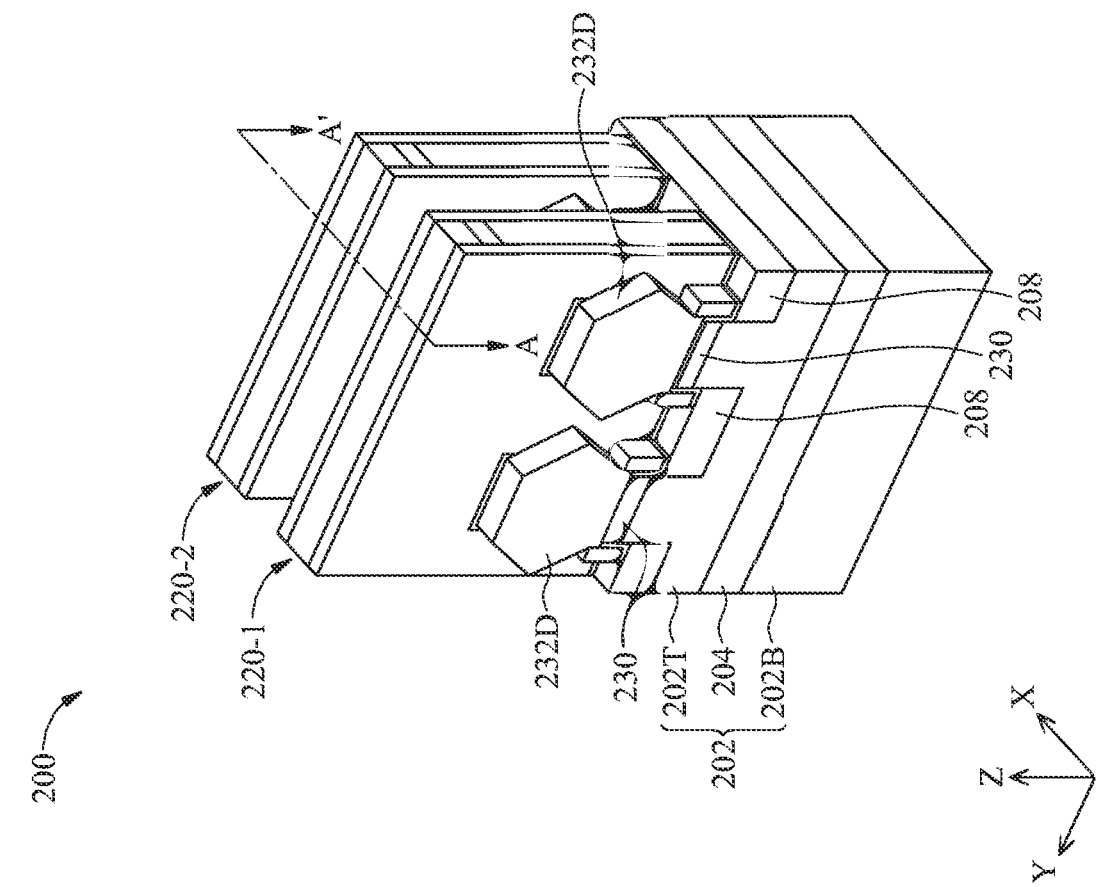

Now referring to FIGS. 1, 11A, and 11B, at operation 130, epitaxial S/D features 232S and 232D (all referred to as epitaxial S/D features 232) are formed in the S/D trenches 224. In the depicted embodiment, the epitaxial source feature 232S is epitaxial grown in the source trench 224S and the epitaxial drain features 232D are epitaxial grown in the drain trenches 224D, respectively. In some embodiments, the epitaxial S/D features 232 may comprise a semiconductor material such as Si or Ge; a compound semiconductor such as SiGe, SiC, gallium arsenide (GaAs), etc.; an alloy semiconductor; or combinations thereof. An epitaxy process may be implemented to epitaxially grow the S/D features 232. The epitaxy process may comprise CVD deposition (for example, vapor-phase epitaxy (VPE), ultra-high vacuum CVD (UHV-CVD), low-pressure CVD (LPCVD), and/or plasma-enhanced (PECVD)), molecular beam epitaxy (MBE), other suitable selective epitaxial growth (SEG) processes, or combinations thereof. The epitaxial S/D features 232 may be doped with n-type dopants and/or p-type dopants. In some embodiments, the epitaxial S/D features 232 may comprise multiple epitaxial semiconductor layers, and different epitaxial semiconductor layers are different in amount of dopant comprised therein. As depicted in FIG. 11B, the epitaxial source feature 232S has a bottom surface below the bottom surface of the bottom dielectric layer 230 and contacts the substrate 202. Referring to FIG. 11B, the bottom surface of the epitaxial source feature 232S has a width W1. In some embodiments, the width W1 is more than about 10 nm. The epitaxial drain features 232D have bottom surfaces contacting the bottom dielectric layer 230. In other words, the epitaxial source feature 232S punches through the bottom dielectric layer 230 and connect to the top portion 202T of the substrate 202, while the epitaxial drain features 232D are separated from the substrate 202 by the bottom dielectric layer 230.

Figure 12B:
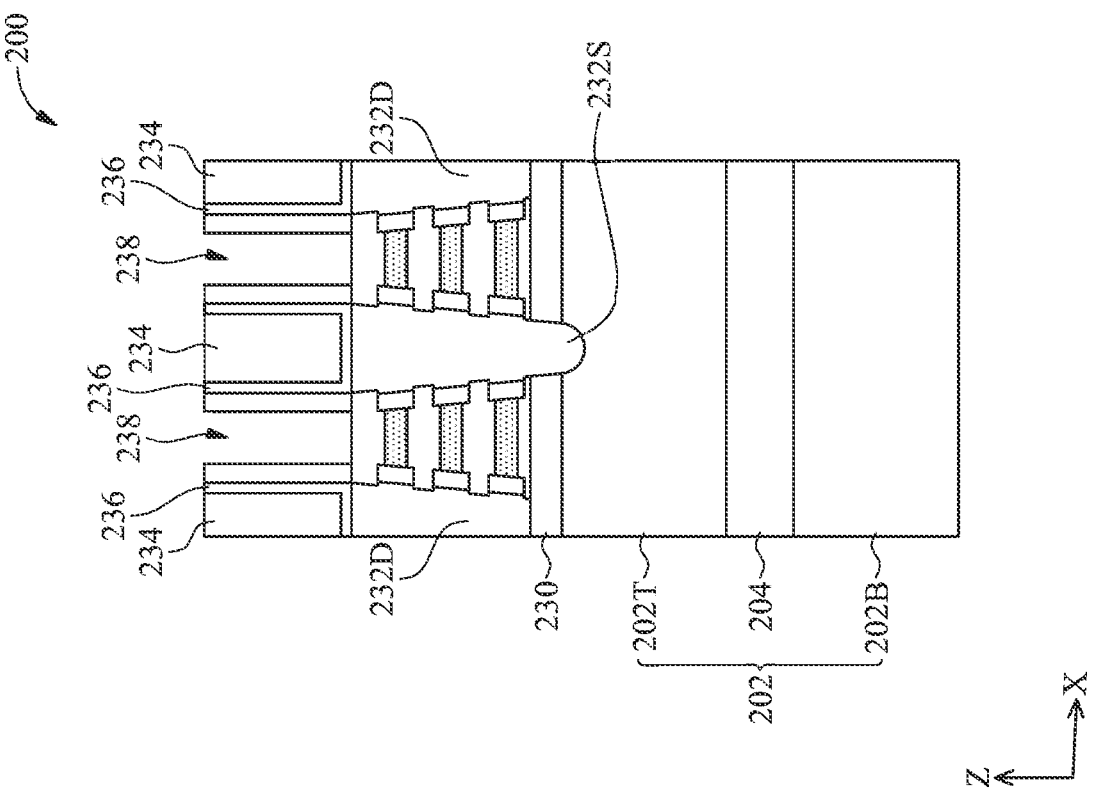
Figure 12A:
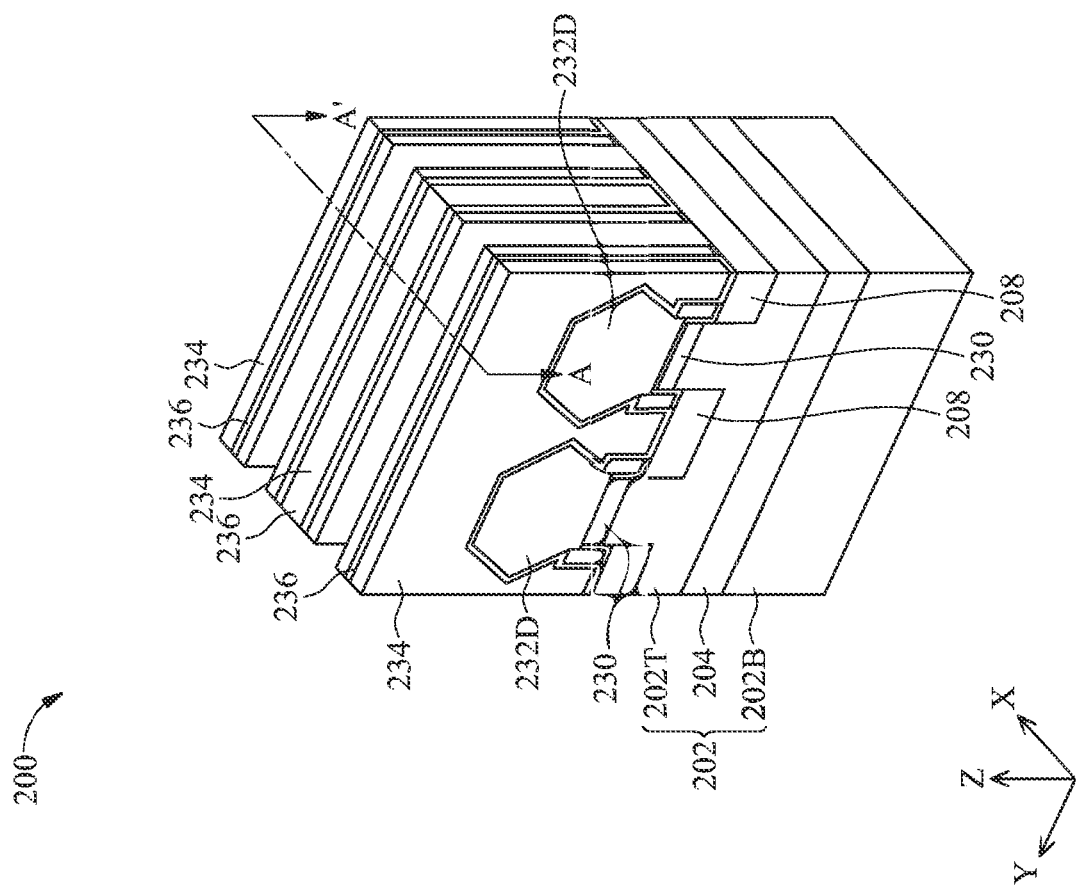

Now referring to FIGS. 1, 12A, 12B, 13A, 13B, 14A, and 14B, at operation 135, a metal gate replacement process is performed to replace the dummy gate structures 220-1 and 220-2 with metal gate structures 240-1 and 240-2, respectively. Both metal gate structures 240-1 and 240-2 are referred to as metal gate structures 240. The metal gate replacement process includes various processing steps. For example, first, an interlayer dielectric (ILD) layer 234 is formed over the substrate 202. As illustrated in FIGS. 12A and 12B, the ILD layer 234 is disposed along the gate spacers 222 and over the isolation structure 208 and the epitaxial S/D features 232. In some embodiments, an etch stop layer (ESL) 236 is deposited before the ILD layer 234 and between the ILD layer 234 and the isolation structure 208 and between the ILD layer 234 and the epitaxial S/D features 232. In some embodiments, the ESL 236 includes a dielectric material such as SiO, SiON, SiN, SiCN, SiOC, SiOCN, other suitable materials, or combinations thereof. In some embodiments, the ILD layer 234 comprises a low-k (K<3.9) dielectric material, such as tetraethylorthosilicate (TEOS), un-doped silicate glass, or doped silicon oxide such as borophosphosilicate glass (BPSG), fluorosilicate glass (FSG), phosphosilicate glass (PSG), boron doped silicon glass (BSG), other suitable dielectric materials, or combinations thereof. The ESL 236 and the ILD layer 234 may be formed by deposition processes such as CVD, flowable CVD (FCVD), spin-on-glass (SOG), other suitable methods, or combinations thereof.

Thereafter, the dummy gate structures 220 are removed to form gate trenches 238 exposing the channel regions of the stacks 210. In some embodiments, removing the dummy gate structures 220 comprises one or more etching processes, such as wet etching, dry etching, reactive-ion etching (RIE), or other etching techniques. In some embodiments, top portions of the ESL 236, the ILD layer 234, and the spacer 222 are also removed at operation 135. The semiconductor layers 210A and 210B are then exposed in the gate trenches 238.

Figure 13B:
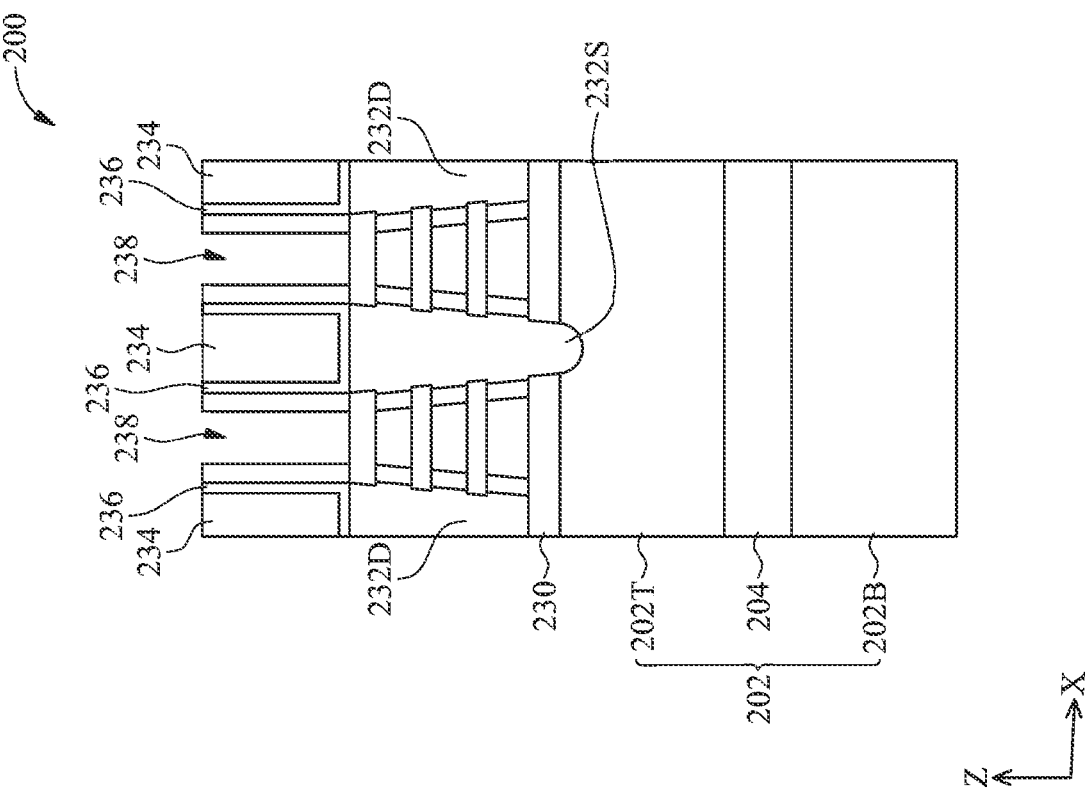
Figure 13A:
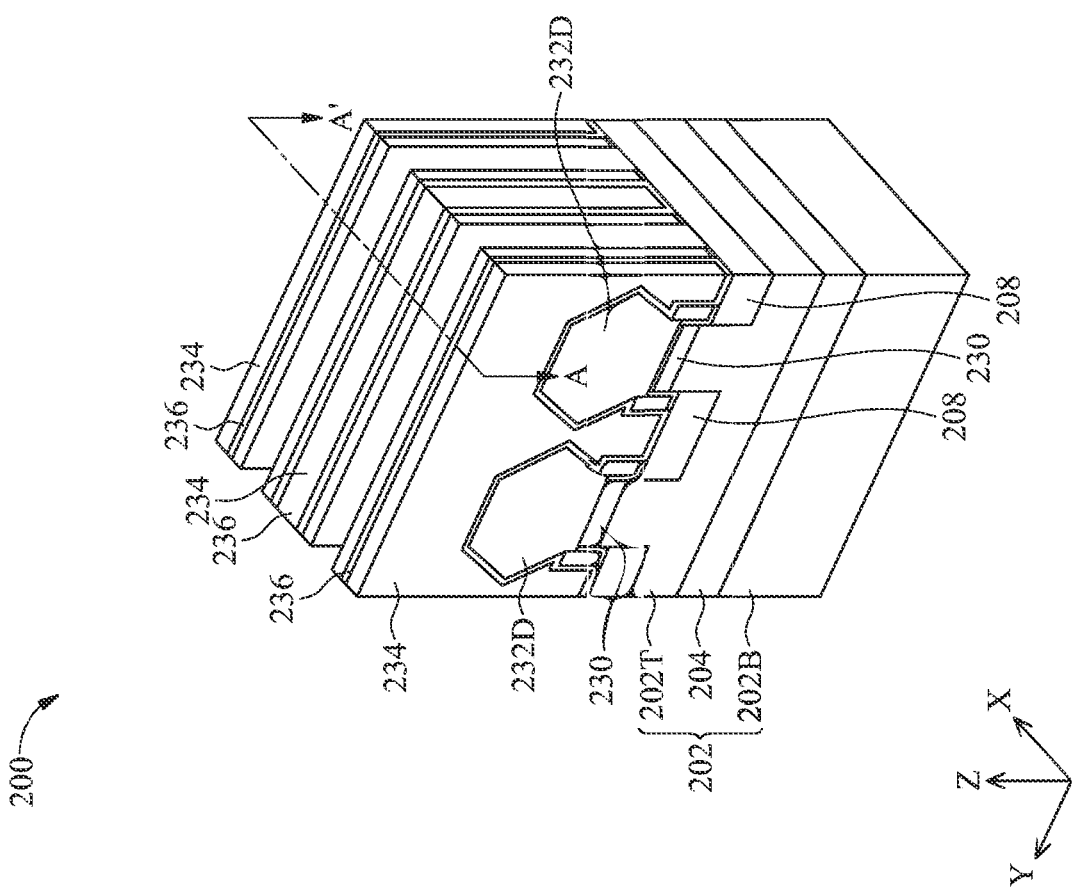

Subsequently, referring to FIGS. 13A and 13B, the semiconductor layers 210B are selectively removed from the gate trenches 238. Due to the different materials of the semiconductor layers 210A and 210B, the semiconductor layers 210B are removed by a selective oxidation/etching process similar as those to remove the edge portions of the semiconductor layers 210B or the sacrificial layer 206. In some embodiments, the semiconductor layers 210A are slightly etched or not etched during the operation 135. Thereby, the semiconductor layers 210A are suspended in the channel region of the stacks 210 and stacked up along a direction (Z-direction) generally perpendicular to a top surface of the substrate 202 (X-Y plane). The suspended semiconductor layers 210A are also referred to as channel semiconductor layers 210A.

Figure 14B:
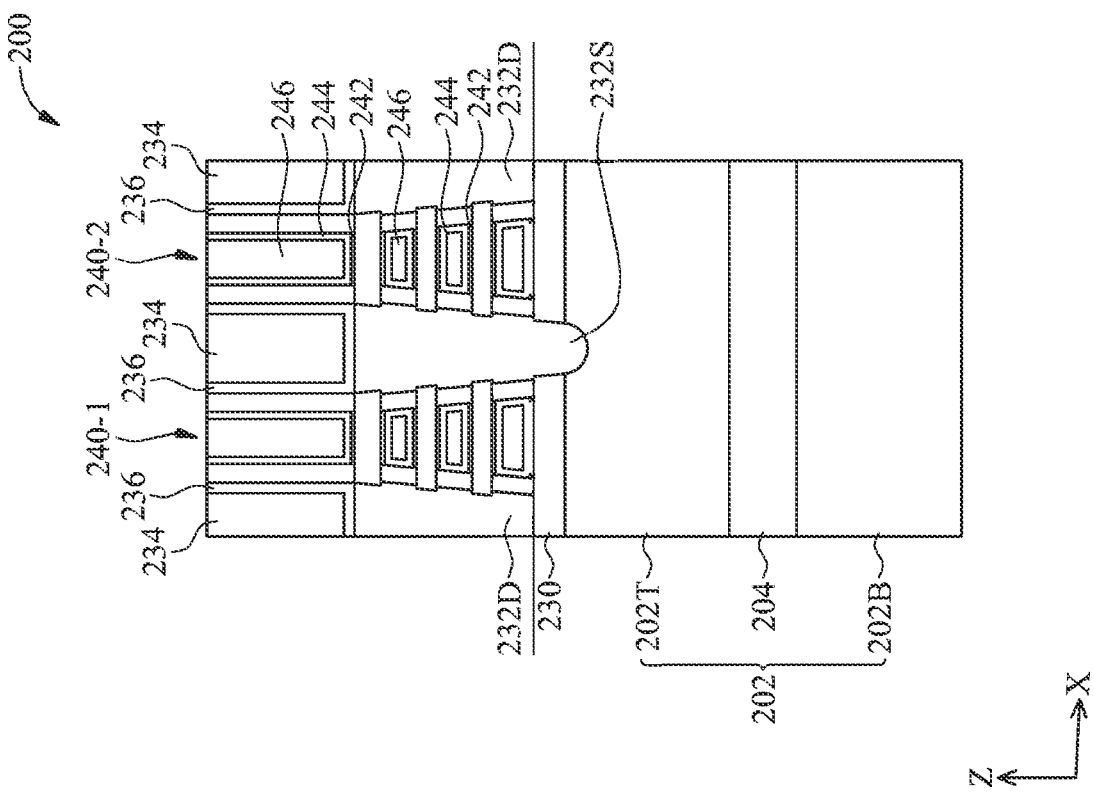
Figure 14A:
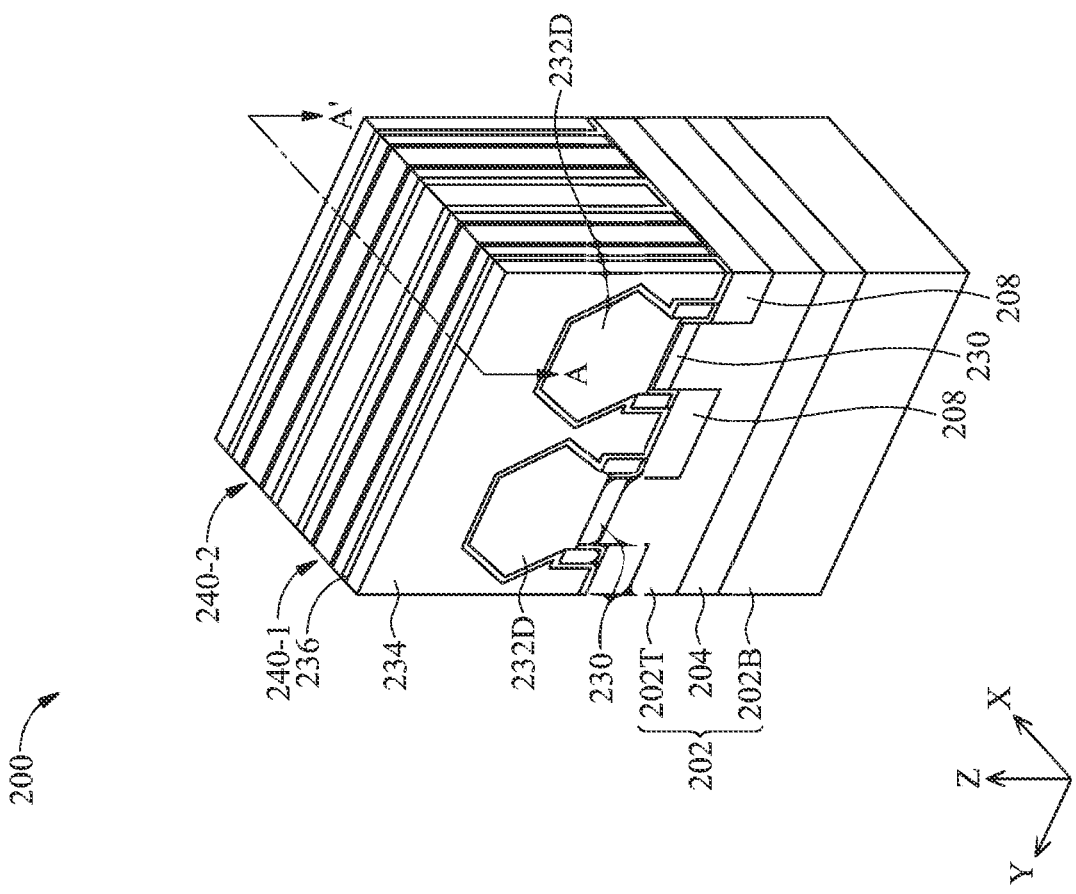

Then, referring to FIGS. 14A and 14B, metal gate structures 240 are formed in the channel regions of the stacks 210. The metal gate structures 240 wrap each of the suspended semiconductor layers 210A. And each metal gate structure 240 includes an interfacial layer 242, a gate dielectric layer 244, a metal gate electrode 246, and other metal gate layers. In some embodiments, the interfacial layer 242 includes any suitable material, for example, SiO. The gate dielectric layer 244 includes a high-k (K>3.9) dielectric material, such as HfO2, HfSiO, HfSiO4, HfSiON, HfLaO, HfTaO, HfTiO, HfZrO, HfAlOx, ZrO, ZrO2, ZrSiO2, AlO, AlSiO, Al2O3, TiO, TiO2, LaO, LaSiO, Ta2O3, Ta2O5, Y2O3, SrTiO3, BaZrO, BaTiO3 (BTO), (Ba,Sr)TiO3 (BST), Si3N4, hafnium dioxide-alumina (HfO2-Al2O3) alloy, other suitable high-k dielectric material, or combinations thereof. In some embodiments, the interfacial layer 242 and the gate dielectric layer 244 are deposited by CVD, PVD, ALD, and/or other suitable method. The metal gate electrodes 246 are then filled in the spaces between the gate dielectric layer 244. Each metal gate electrode 246 includes one or more work function metal (WFM) layers and a bulk metal. The WFM layer is configured to tune a work function of its corresponding transistor to achieve a desired threshold voltage Vt. And, the bulk metal is configured to serve as the main conductive portion of the functional gate structure. In some embodiments, the material of the WFM layer may include TiAl, TiAlC, TaAlC, TiAlN, TiN, TSN, TaN, WCN, Mo, other materials, or combinations thereof. The bulk metal may include Al, W, Cu, or combinations thereof. The various layers of the metal gate electrodes 246 may be formed by any suitable method, such as CVD, ALD, PVD, plating, chemical oxidation, thermal oxidation, other suitable methods, or combinations thereof. Thereafter, one or more polishing processes (for example, CMP) are applied to remove any excess conductive materials and planarize the top surface of the device 200.

Figure 15A:
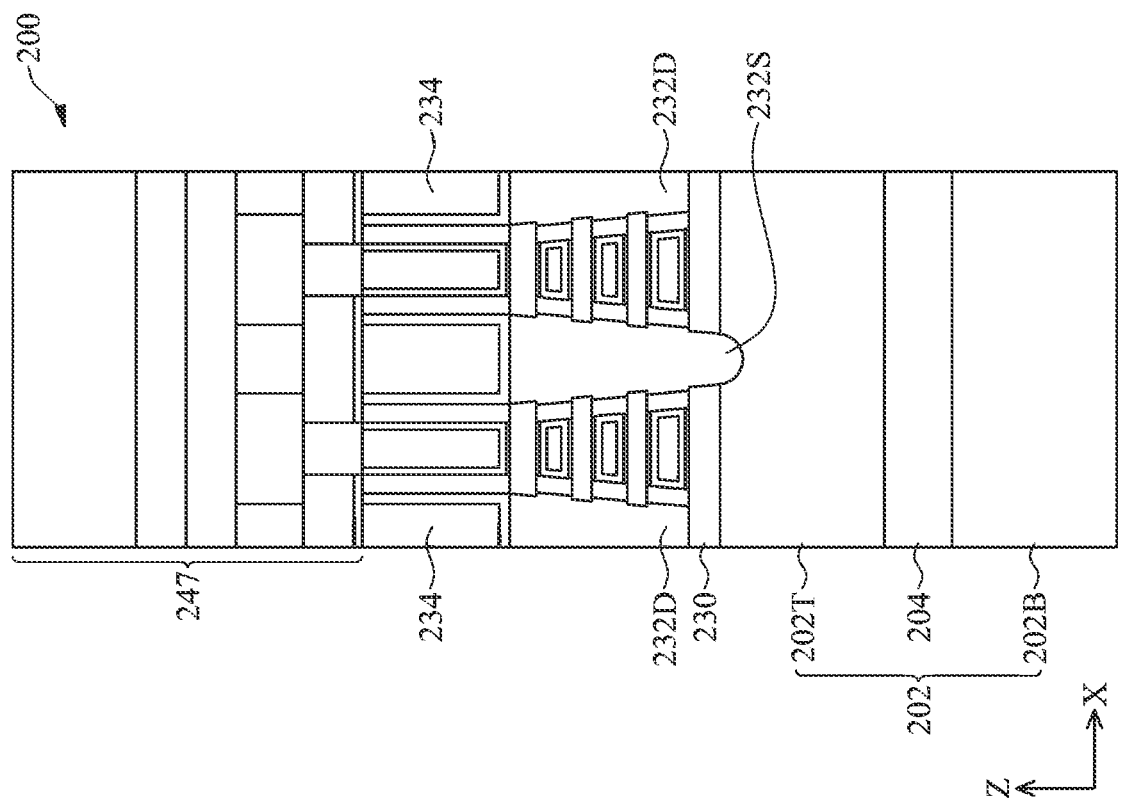
Figure 15B:
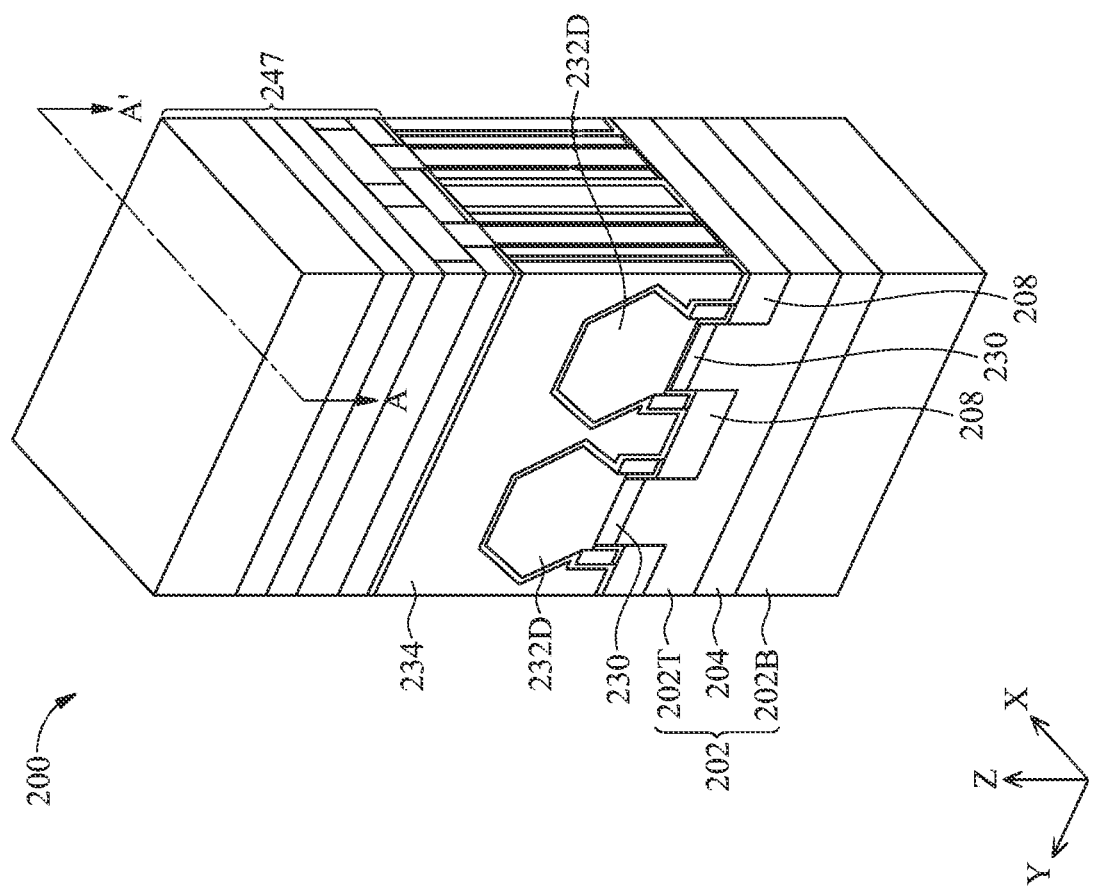
Figure 16B:
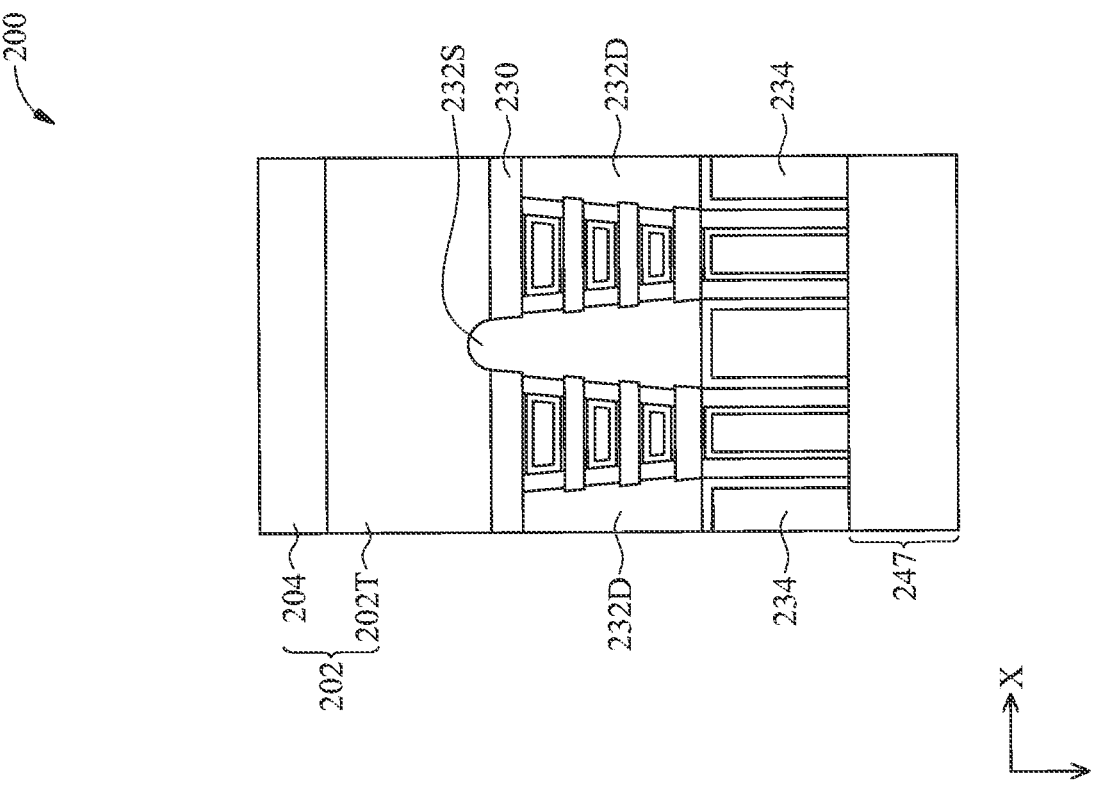
Figure 16A:
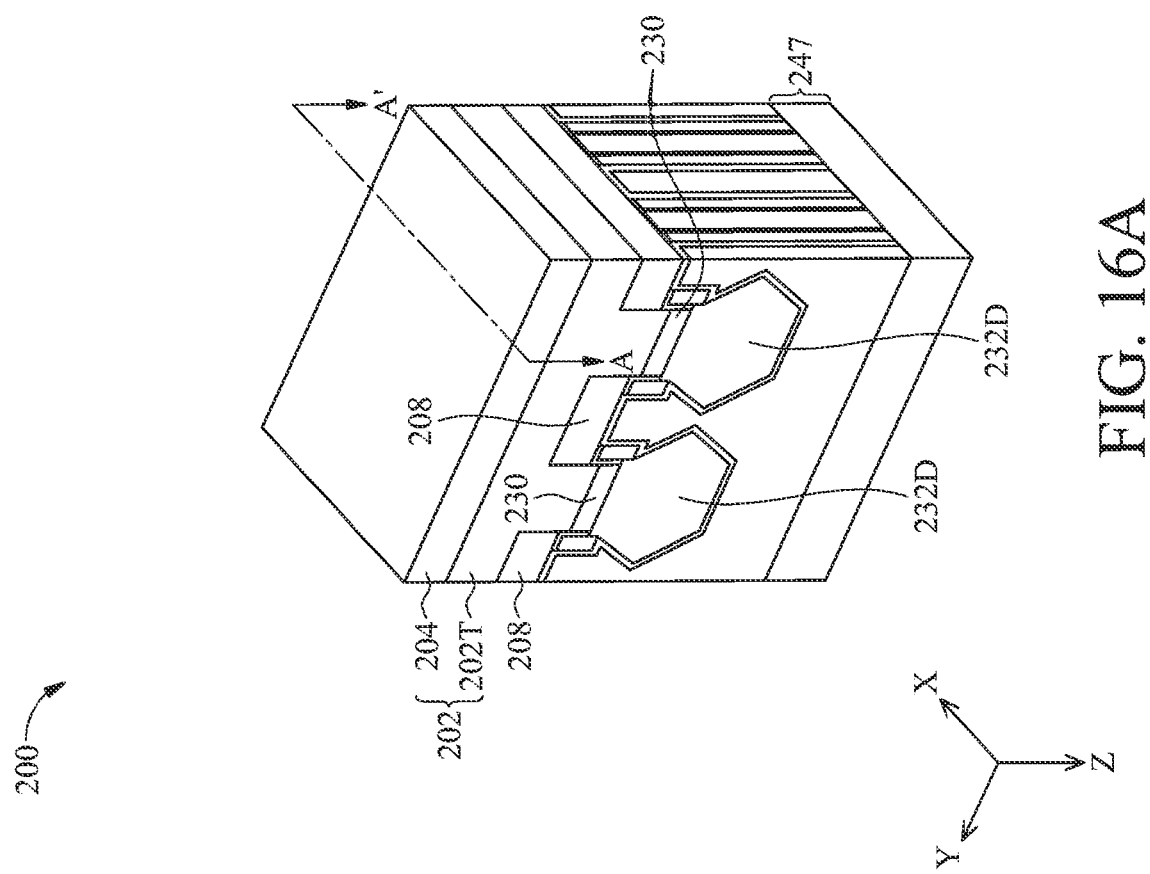

Now referring to FIGS. 1, 15A, and 15B, at operation 140, various interconnection structures 247 are formed over the top (i.e. the front side) of the device 200. In some embodiments, the various interconnection structures 247 may include dielectric ESL, ILD layers, conductive S/D contacts, vias, metal lines, and/or other structures, configured to connect the various features to form a functional circuit that may include one or more multi-gate devices. The interconnection structures 247 are simplified in the later drawings.

Now referring to FIGS. 1, 16A, 16B, 17A, 17B, 18A, and 18B, at operation 145, portions of the substrate 202 below the isolation structure 208 are removed from the bottom (i.e. the backside) of the device 200. For the convenience of discussion, FIGS. 15A and 15B and the following figures show the device 200 in an upside-down direction. The removal of the portions of the substrate 202 includes various steps. For example, referring to FIGS. 16A and 16B, the bottom portion 202B of the substrate 202 is removed until the semiconductor layer 204 is exposed (i.e. the semiconductor layer 204 is served as an ESL). In some embodiments, the bottom portion 202B of the substrate 202 is removed by a CMP or other planarization process. In some further embodiments, the removal of the bottom portion 202B of the substrate 202 involves an etching process, such as wet etching, dry etching, other etching process, or a combination thereof.

Figure 17B:
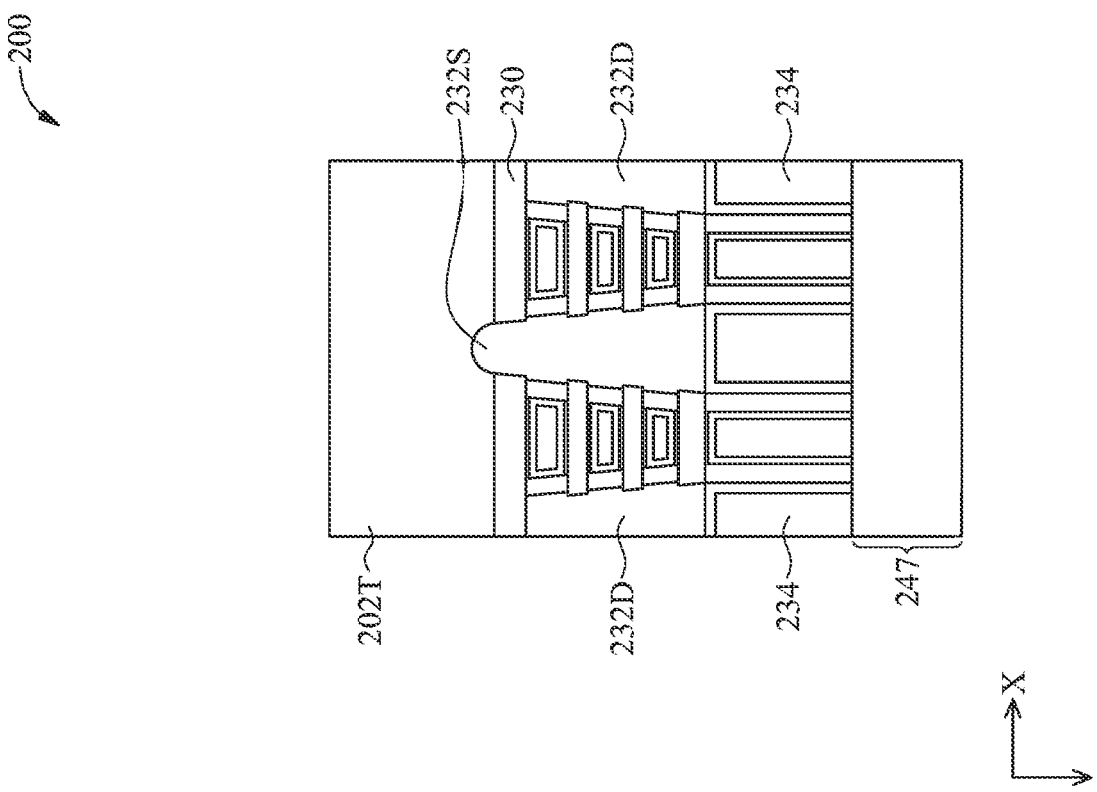
Figure 17A:
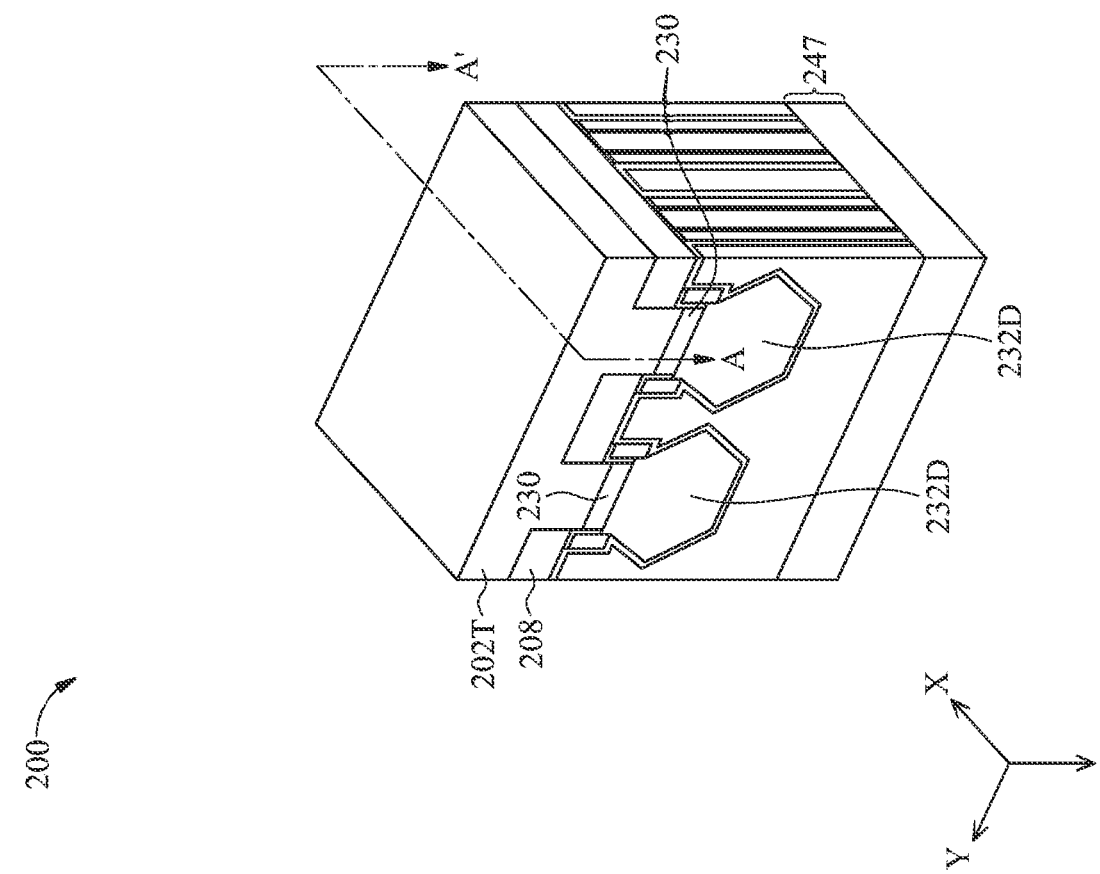

Thereafter, referring to FIGS. 17A and 17B, the semiconductor layer 204 is selectively removed since it includes a material (for example, SiGe with Ge concentration of more than about 15%) has a different selectivity from the substrate 202. The selective removal of the semiconductor layer 204 is similar as the aforementioned selective oxidation/etching process to remove the semiconductor layers 210B and the sacrificial layer 206.

Figure 18B:
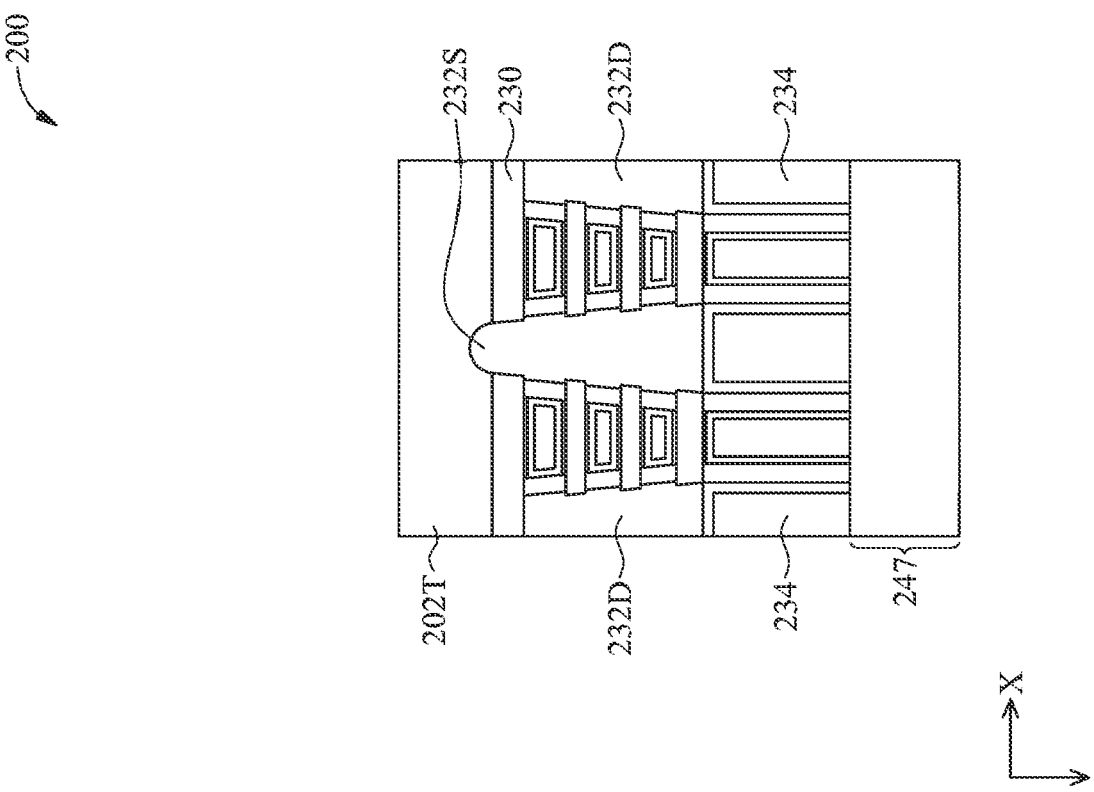
Figure 18A:
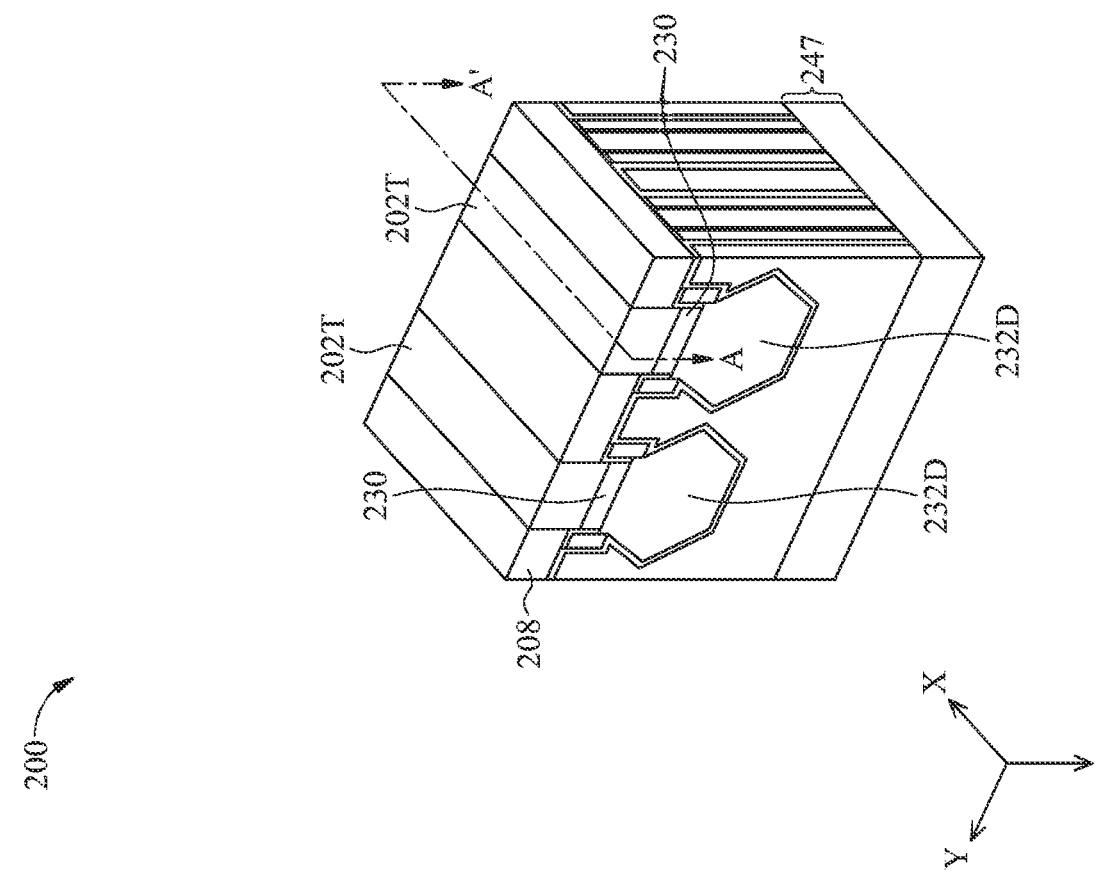

Thereafter, referring to FIGS. 18A and 18B, the top portion 202T of the substrate 202 below the isolation structure 208 is removed to expose the isolation structure 208 from the bottom of the device 200. Similar as the removal of the bottom portion 202B, the top portion 202T of the substrate 202 may be removed by a planarization process (for example, CMP) and/or an etching process (for example, wet etching, dry etching, or combinations thereof).

Figure 19B:
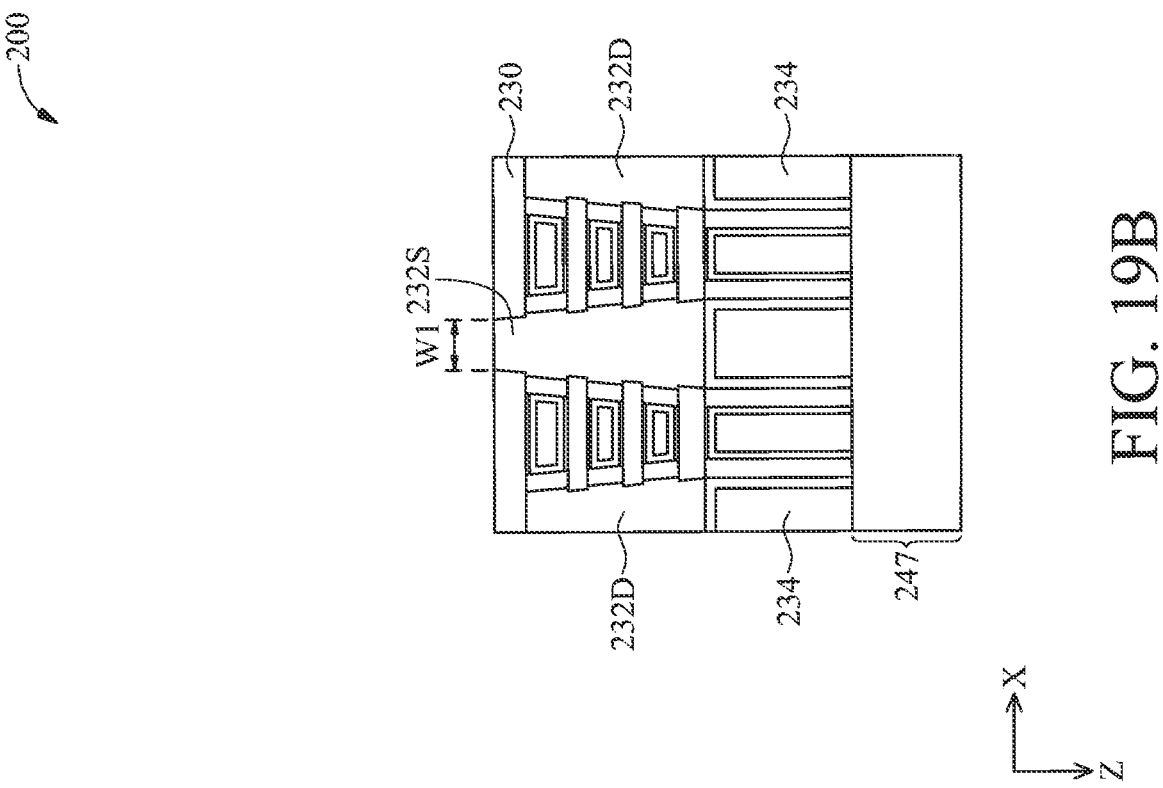
Figure 19A:
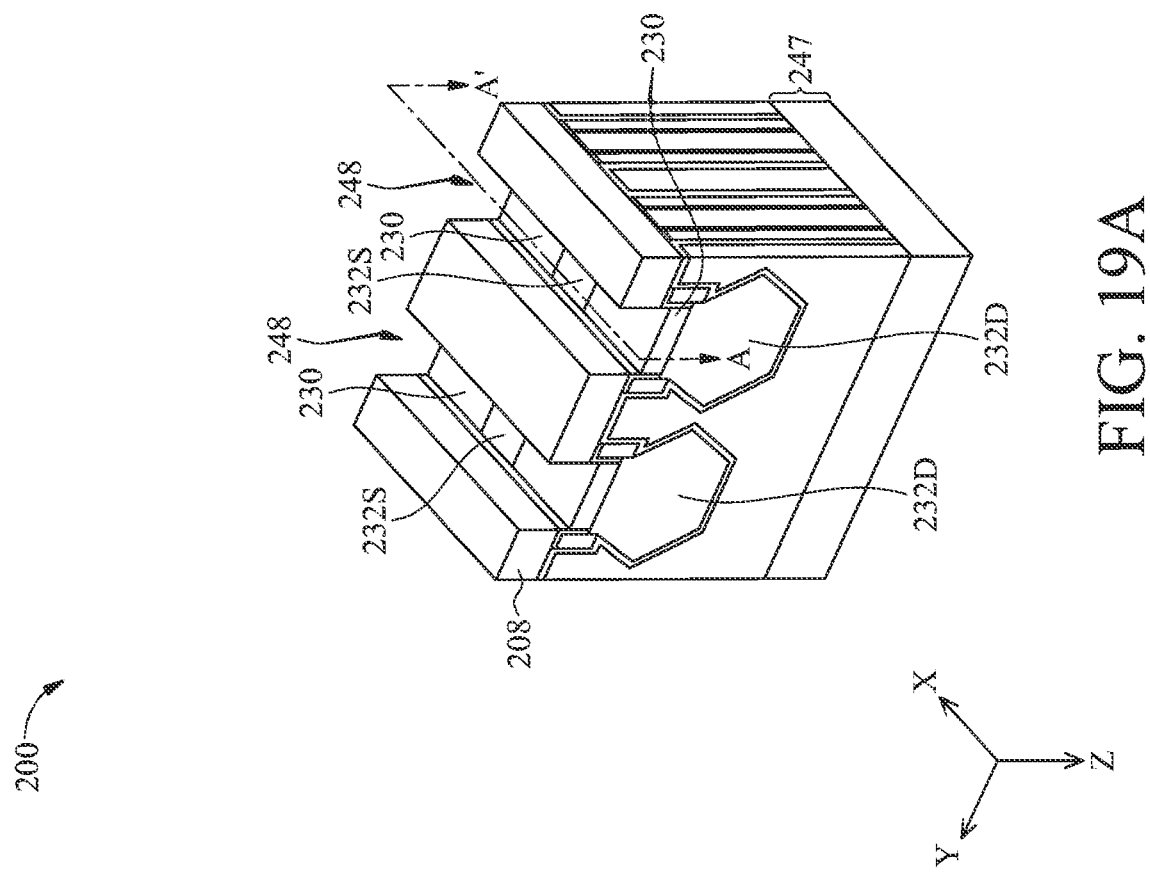

Now referring to FIGS. 1, 19A and 19B, at operation 150, the remained portions of the substrate 202 between the isolation structure 208 are selectively removed to form via trenches 248. In some embodiments, before removing the remained portions of the substrate 202, a lithography hard mask is formed to cover the electrostatic discharge (ESD) region(s) of the device 200, such that the following operations including operations 150, 155, and 160 are only applied to the non-ESD region(s) of the device 200. The substrate 202 includes a material having a different selectivity from the isolation structure 208, the bottom dielectric layer 230, and the epitaxial S/D features 232, thus the remained portions of the substrate 202 can be selectively removed, for example, by a selective etching process. Therefore, via trenches 248 are formed between the isolation structure 208. As depicted in FIG. 19A, the bottom dielectric layer 230 and the bottom surface of the epitaxial source feature 232S are exposed from the via trenches 248. Referring to FIG. 19B, the width of the exposed bottom surface of the epitaxial source feature 232S is W 1, which is more than about 10 nm. The bottom surfaces of the metal gate structures 240 and the epitaxial drain features 232D in the drain regions are blocked by the bottom dielectric layer 230 and thus are not exposed. Therefore, the bottom dielectric layer 230 can serve as a self-align layer to decide the contacting position of the later formed power rail vias 250 and the epitaxial source feature 232S, i.e. the power rail vias 250 only contact the epitaxial S/D feature in the source region (epitaxial source feature 232S), not those in the drain region (epitaxial drain features 232D) and not the metal gate structures 240.

Figure 20A:
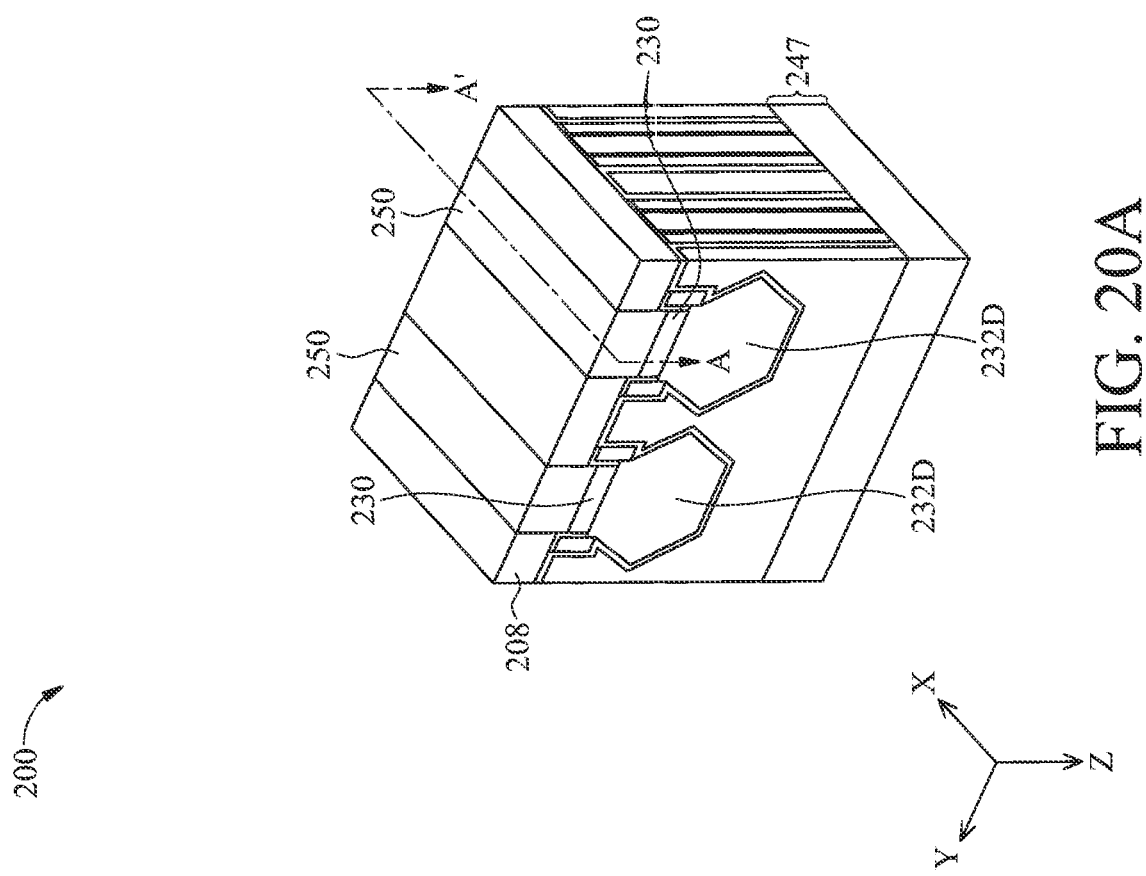

Now referring to FIGS. 1, 20A and 20B, at operation 155, power rail vias 250 are formed in the via trenches 248. In some embodiments, the power rail vias 250 includes a conductive material such as W, Ru, Co, Cu, Mo, Ni, Ti, TiN, Ta, TaN, other conductive material, or combinations thereof. In some embodiments, the conductive material of the power rail vias 250 are deposited by any suitable process in the via trenches 248 and contacting the bottom dielectric layer 230. And a planarization process (for example, CMP) is performed to remove the excess conductive material and expose the bottom dielectric layer 230. Thereby, the remained conductive material forms the vias 250. In some embodiments, a silicide layer 252 is formed between the epitaxial source feature 232S and the power rail vias 250 to reduce the parasitic resistance therebetween. For example, an annealing process may be performed to form the silicide layer 252 between the vias 250 and the epitaxial source feature 232S. The heat causes the constituents of the epitaxial source feature 232S to react with the power rail vias 250, thus the silicide layer 252 may include the conductive material of the power rail vias 250 and the constituent of the epitaxial source feature 232S, for example, TiSi, CoSi, MoSi, and etc. Referring to FIG. 20A, a width of the contact portion between the epitaxial source feature 232S and the power rail via 250 is W 1, which is more than about 10 nm.

Figure 21B:
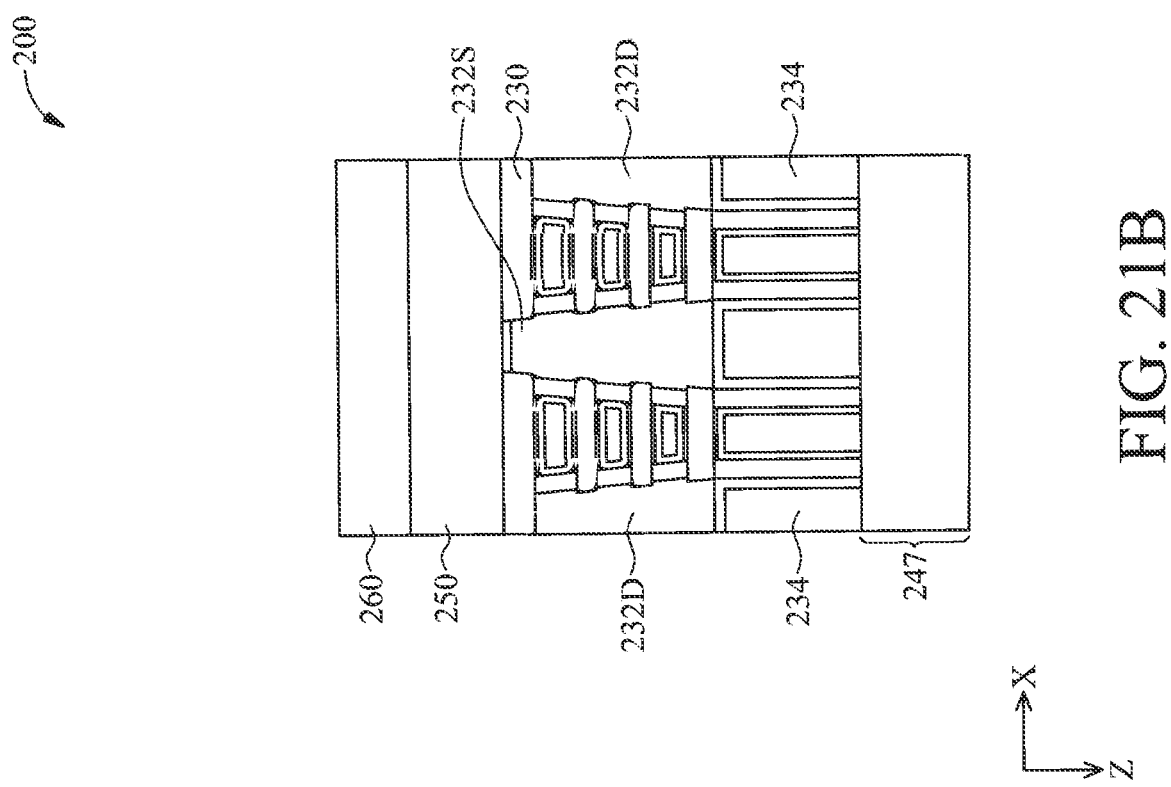
Figure 21A:
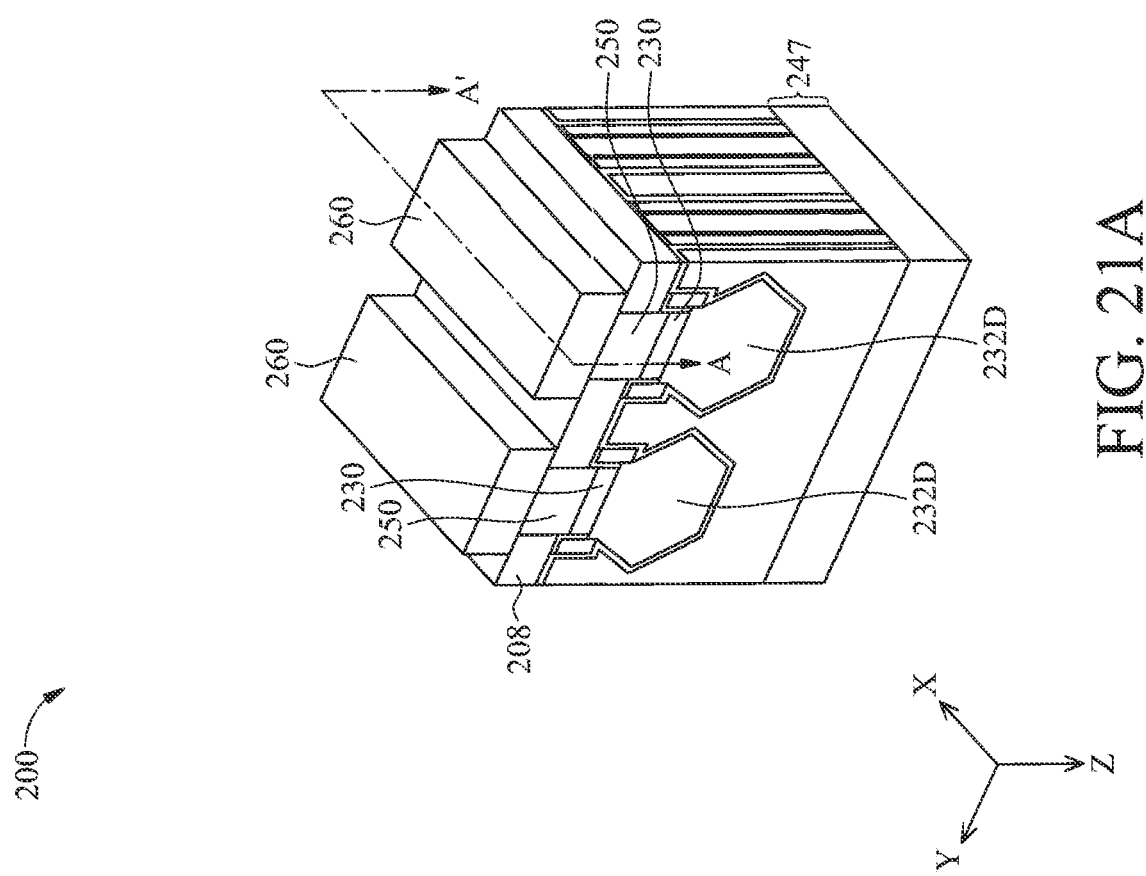

Now referring to FIGS. 1, 21A and 21B, at operation 160, power rail 260 is formed on the bottom (i.e. the backside) of the device 200. In some embodiments, the power rail 260 includes a conductive material such as Cu, Al, Co, W, Ti, Ta, Ru, other metal material, or combinations thereof. The power rail 260 may be formed by any suitable method, such as CVD, ALD, PVD, plating, chemical oxidation, thermal oxidation, other suitable methods, or combinations thereof. And, the shape of the power rail 260 can be patterned via a photoresist and/or etching process according to the design requirements of the device 200.

Figure 22B:
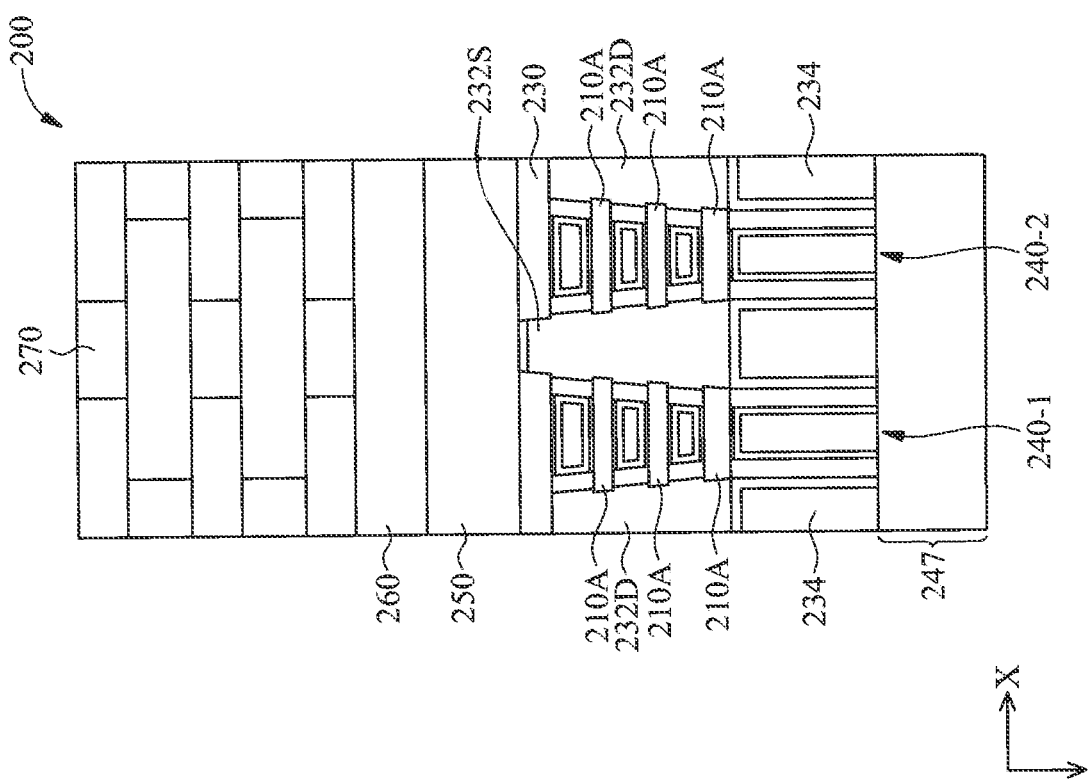
Figure 22A:
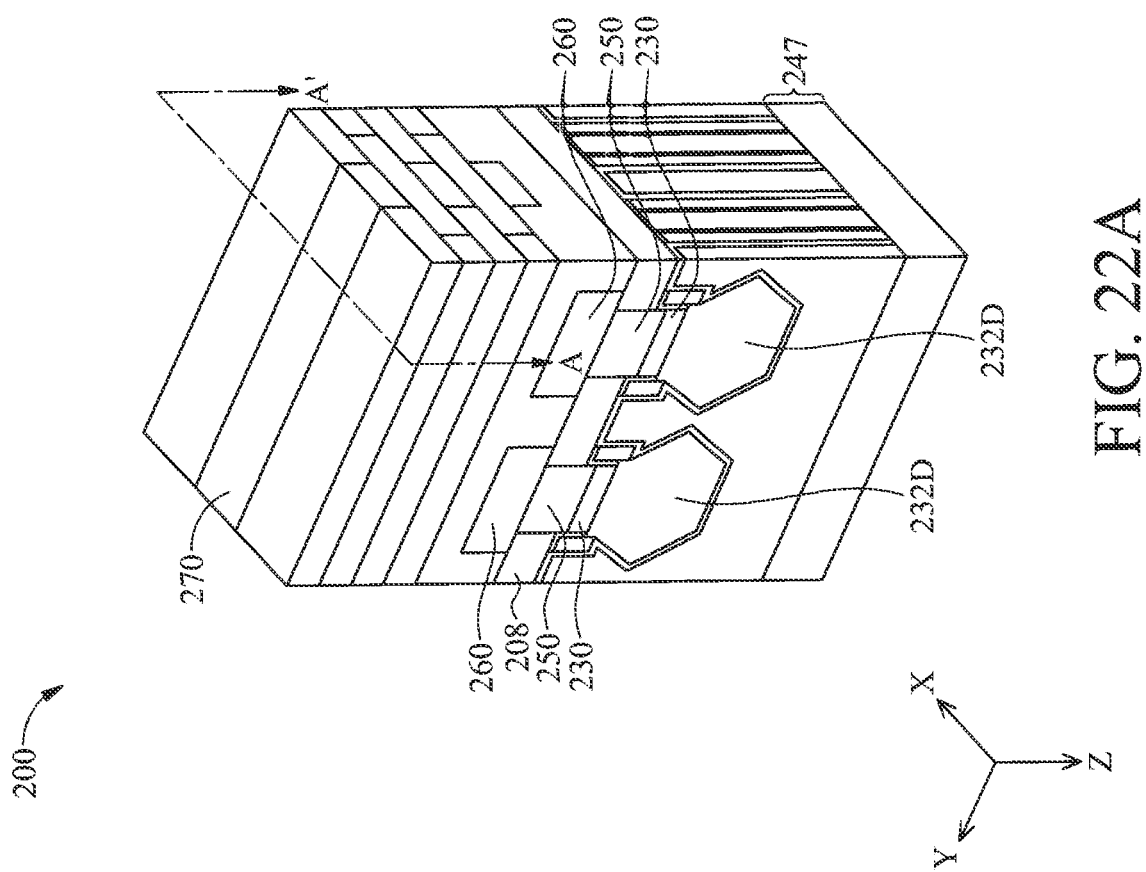

Now referring to FIGS. 1, 22A and 22B, at operation 165, other backside contact features 270 are formed such that the epitaxial source feature 232S can connect to the corresponding power supply (for example, Vdd) through the self-aligned power rail vias 250 and the power rail 260.

In a convention power rail scheme, due to the process limitation and fabrication constraint, overlay shifting issues may happen during the formation of the power rail vias, thus short circuit issues may occur between the power rail and the metal gate, and/or between the source and drain regions. However, in the present disclosure, a bottom dielectric layer is formed under the channel region and extends to the S/D regions. The bottom dielectric layer leaves an opening exposing only one type of the epitaxial S/D features (for example, the source feature), thereby power rail via can contact the exposed type of the S/D features in a self-aligned manner. Thus, the short circuit issues can be mitigated.

Although not intended to be limiting, one or more embodiments of the present disclosure provide many benefits to an integrated circuit and a formation process thereof. For example, embodiments of the present disclosure provide a semiconductor device including a bottom dielectric layer below the channel regions and extends below one type of the S/D regions (for example, the drain regions). The bottom dielectric layer provides an opening at the bottom of one type of the S/D features (for example, the source features) and isolates the other type of the S/D features (for example, the drain features) and the metal gate from the backside power rails. Thus, the power rails only contact the exposed S/D features through the self-aligned vias and the short circuits issues between the power rails and the metal gate and between the source features and the drain features can be mitigated. Therefore, the reliability and the performance of the semiconductor device is improved.

The present disclosure provides for many different embodiments. Semiconductor device having backside self-aligned power rail and methods of fabrication thereof are disclosed herein. An exemplary semiconductor device comprises a dielectric layer formed over a conductive feature; a semiconductor stack formed over the dielectric layer, wherein the semiconductor stack including semiconductor layers stacked up and separated from each other; a first metal gate structure and a second metal gate structure formed over a channel region of the semiconductor stack, wherein the first metal gate structure and the second metal gate structure wrap each of the semiconductor layers of the semiconductor stack; and a first epitaxial feature disposed between the first metal gate structure and the second metal gate structure over a first source/drain region of the semiconductor stack, wherein the first epitaxial feature extends through the dielectric layer and contacts the conductive feature In some embodiments, the exemplary semiconductor device further comprises a power rail formed below the conductive feature, wherein the power rail electrically contacts the first epitaxial feature via the conductive feature.

In some embodiments, the exemplary semiconductor device further comprises a second epitaxial feature disposed over a second source/drain region of the semiconductor stack, wherein a bottom surface of the second epitaxial feature is over a top surface of the dielectric layer.

In some embodiments, the exemplary semiconductor device further comprises an isolation feature disposed along sidewalls of the conductive feature and separating active regions of the semiconductor device.

In some embodiments, a thickness of the dielectric layer is about 6 nm to about 20 nm. In some embodiments, a width of a contact portion between the conductive feature and the first epitaxial feature is more than about 10 nm. In some embodiments, the first epitaxial feature includes a silicide layer formed at a bottom surface of the first epitaxial feature contacting the conductive feature.

A method of forming a semiconductor device comprises forming a semiconductor stack over a substrate, wherein the semiconductor stack includes a sacrificial layer, and first semiconductor layers and second semiconductor layers alternately stacked up over the sacrificial layer, and each of a material of the first semiconductor layers, a material of the second semiconductor layers, and a material of the sacrificial layer provides a different etching selectivity; forming a first dummy gate structure and a second dummy gate structure over the semiconductor stack; forming a first source/drain (S/D) trench between the first dummy gate structure and the second dummy gate structure, wherein the first S/D trench extends below the sacrificial layer; replacing the sacrificial layer with a dielectric layer; and epitaxially growing a first epitaxial feature in the first S/D trench, wherein a bottom portion of the first epitaxial feature separates the dielectric layer between the first dummy gate structure and the second dummy gate structure.

In some embodiments, the exemplary method further comprises forming an isolation feature around a lower portion of the semiconductor stack to isolate active regions of the semiconductor device; selectively removing the second semiconductor layers; replacing the first dummy gate structure with a first metal gate structure and replacing the second dummy gate structure a second metal gate structure, wherein the first metal gate structure and the second metal gate structure wrap each of the first semiconductor layers; removing the substrate and the lower portion of the semiconductor stack to form an opening in the isolation feature, wherein the dielectric layer and the bottom portion of the first epitaxial feature are exposed from the opening; and forming a conductive feature below the dielectric layer and the bottom portion of the first epitaxial feature in the opening. In some embodiments, the exemplary method further comprises forming a power rail below and contacting the conductive feature. In some embodiments, a top surface of the isolation feature is below a bottom surface of the sacrificial layer.

In some embodiments, the exemplary method further comprises depositing an etch stop layer (ESL) in the substrate below the sacrificial layer, wherein the ESL separates the substrate to a first portion above the ESL and below the isolation feature and a second portion below the ESL; wherein the removing the substrate and the lower portion of the semiconductor stack includes removing the second portion of the substrate to expose the ESL; selectively removing the ESL; removing the first portion of the substrate to expose the isolation feature; and selectively removing the lower portion of the semiconductor stack to form the opening in the isolation feature.

In some embodiments, the forming the first S/D trench between the first dummy gate structure and the second dummy gate structure includes removing a portion of the semiconductor stack along sidewalls of the first dummy gate structure and the second dummy gate structure to form a first S/D trench between the first dummy gate structure and the second dummy gate structure; and further recessing the first S/D trench such that a bottom surface of the first S/D trench is below a bottom surface of the sacrificial layer. In some embodiments, the exemplary method further comprises removing a portion of the semiconductor stack along a sidewall of the second dummy gate structure away from the first dummy gate structure to form a second S/D trench, wherein a bottom surface of the second S/D trench is above a top surface of the sacrificial layer; and epitaxially growing a second epitaxial feature in the second S/D trench, wherein a bottom surface of the second epitaxial feature is above a top surface of the sacrificial layer.

In some embodiments, the replacing the sacrificial layer with the dielectric layer includes selectively removing the sacrificial layer from the first S/D trench to form a gap; depositing a dielectric material in the gap; and removing a portion of the dielectric material in the first S/D trench such that the first S/D trench extending through the dielectric material.

Another method of forming a semiconductor device comprises forming a sacrificial layer over a substrate; alternately depositing first semiconductor layers and second semiconductor layers over the sacrificial layer, wherein each of a material of the first semiconductor layers, a material of the second semiconductor layers, and a material of the sacrificial layer provides a different etching selectivity; patterning the first semiconductor layers, the second semiconductor layers, the sacrificial layer, and a top portion of the substrate to form a semiconductor stack; forming a first dummy gate structure and a second dummy gate structure over the semiconductor stack; etching along sidewalls of the first dummy gate structure and the second dummy gate structure to form a first source/drain (S/D) trench between the first dummy gate structure and the second dummy gate structure, and a second S/D trench along a sidewall of the second dummy gate structure away from the first dummy gate structure, wherein bottom surfaces of the first S/D trench and the second S/D trench are above the sacrificial layer; further etching the first S/D trench such that the bottom surface of the first S/D trench is below a bottom surface of the sacrificial layer, while keeping the second S/D trench unchanged; replacing the sacrificial layer with a dielectric layer; and epitaxially growing a first epitaxial feature in the first S/D trench and a second epitaxial feature in the second S/D trench.

In some embodiments, the method further comprises selectively removing the second semiconductor layers; replacing the first dummy gate structure with a first metal gate structure and replacing the second dummy gate structure a second metal gate structure, wherein the first and second metal gate structures wrap each of the first semiconductor layers; removing the substrate to expose the first epitaxial feature and the dielectric layer; and forming a conductive feature contacting the dielectric layer and the first epitaxial feature.

In some embodiments, the method further comprises forming an isolation feature around a lower portion of the semiconductor stack, wherein a top surface of the isolation feature is below a bottom surface of the sacrificial layer; wherein the removing the substrate includes removing a bottom portion of the substrate to expose the isolation feature; and removing the top portion of the substrate to form an opening in the isolation feature to expose the first epitaxial feature and the dielectric layer.

In some embodiments, the further etching the first S/D trench includes forming a patterned photoresist layer over the first dummy gate structure and the second dummy gate structure, wherein the patterned photoresist layer exposes the first S/D trench; and removing a portion of the sacrificial layer between the first dummy gate structure and the second dummy gate structure through the patterned photoresist layer. In some embodiments, a width of a removed portion of the sacrificial layer is more than about 10 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a dielectric layer formed over a conductive feature;
a semiconductor stack formed over the dielectric layer, wherein the semiconductor stack including semiconductor layers stacked up and separated from each other;
a first metal gate structure and a second metal gate structure formed over a channel region of the semiconductor stack, wherein the first metal gate structure and the second metal gate structure wrap each of the semiconductor layers of the semiconductor stack; and
a first epitaxial feature disposed between the first metal gate structure and the second metal gate structure over a first source/drain region of the semiconductor stack, wherein the first epitaxial feature extends through the dielectric layer and contacts the conductive feature.

2. The semiconductor device of claim 1, further comprising a power rail formed below the conductive feature, wherein the power rail electrically contacts the first epitaxial feature via the conductive feature.

3. The semiconductor device of claim 1, further comprising a second epitaxial feature disposed over a second source/drain region of the semiconductor stack, wherein a bottom surface of the second epitaxial feature is over a top surface of the dielectric layer.

4. The semiconductor device of claim 1, further comprising an isolation feature disposed along sidewalls of the conductive feature and separating active regions of the semiconductor device.

5. The semiconductor device of claim 1, wherein a thickness of the dielectric layer is about 6 nm to about 20 nm.

6. The semiconductor device of claim 1, wherein a width of a contact portion between the conductive feature and the first epitaxial feature is more than about 10 nm.

7. The semiconductor device of claim 1, wherein the first epitaxial feature includes a silicide layer formed at a bottom surface of the first epitaxial feature contacting the conductive feature.

8. A method of forming a semiconductor device, comprising:
forming a semiconductor stack over a substrate, wherein the semiconductor stack includes a sacrificial layer, and first semiconductor layers and second semiconductor layers alternately stacked up over the sacrificial layer, and each of a material of the first semiconductor layers, a material of the second semiconductor layers, and a material of the sacrificial layer provides a different etching selectivity;
forming a first dummy gate structure and a second dummy gate structure over the semiconductor stack;
forming a first source/drain (S/D) trench between the first dummy gate structure and the second dummy gate structure, wherein the first S/D trench extends below the sacrificial layer;
replacing the sacrificial layer with a dielectric layer; and
epitaxially growing a first epitaxial feature in the first S/D trench, wherein a bottom portion of the first epitaxial feature separates the dielectric layer between the first dummy gate structure and the second dummy gate structure.

9. The method of claim 8, further comprising:
forming an isolation feature around a lower portion of the semiconductor stack to isolate active regions of the semiconductor device;
selectively removing the second semiconductor layers;
replacing the first dummy gate structure with a first metal gate structure and replacing the second dummy gate structure a second metal gate structure, wherein the first metal gate structure and the second metal gate structure wrap each of the first semiconductor layers;
removing the substrate and the lower portion of the semiconductor stack to form an opening in the isolation feature, wherein the dielectric layer and the bottom portion of the first epitaxial feature are exposed from the opening; and
forming a conductive feature below the dielectric layer and the bottom portion of the first epitaxial feature in the opening.

10. The method of claim 9, further comprising:
forming a power rail below and contacting the conductive feature.

11. The method of claim 9, wherein a top surface of the isolation feature is below a bottom surface of the sacrificial layer.

12. The method of claim 8, further comprising:
depositing an etch stop layer (ESL) in the substrate below the sacrificial layer, wherein the ESL separates the substrate to a first portion above the ESL and below the isolation feature and a second portion below the ESL;
wherein the removing the substrate and the lower portion of the semiconductor stack includes:
removing the second portion of the substrate to expose the ESL;
selectively removing the ESL;
removing the first portion of the substrate to expose the isolation feature; and
selectively removing the lower portion of the semiconductor stack to form the opening in the isolation feature.

13. The method of claim 8, wherein the forming the first S/D trench between the first dummy gate structure and the second dummy gate structure includes:
removing a portion of the semiconductor stack along sidewalls of the first dummy gate structure and the second dummy gate structure to form a first S/D trench between the first dummy gate structure and the second dummy gate structure; and
further recessing the first S/D trench such that a bottom surface of the first S/D trench is below a bottom surface of the sacrificial layer.

14. The method of claim 13, further comprising:
removing a portion of the semiconductor stack along a sidewall of the second dummy gate structure away from the first dummy gate structure to form a second S/D trench, wherein a bottom surface of the second S/D trench is above a top surface of the sacrificial layer; and
epitaxially growing a second epitaxial feature in the second S/D trench, wherein a bottom surface of the second epitaxial feature is above a top surface of the sacrificial layer.

15. The method of claim 8, wherein the replacing the sacrificial layer with the dielectric layer includes:
selectively removing the sacrificial layer from the first S/D trench to form a gap;

depositing a dielectric material in the gap; and
removing a portion of the dielectric material in the first S/D trench such that the first S/D trench extending through the dielectric material.

16. A method of forming a semiconductor device, comprising:
forming a sacrificial layer over a substrate;
alternately depositing first semiconductor layers and second semiconductor layers over the sacrificial layer, wherein each of a material of the first semiconductor layers, a material of the second semiconductor layers, and a material of the sacrificial layer provides a different etching selectivity;
patterning the first semiconductor layers, the second semiconductor layers, the sacrificial layer, and a top portion of the substrate to form a semiconductor stack;
forming a first dummy gate structure and a second dummy gate structure over the semiconductor stack;
etching along sidewalls of the first dummy gate structure and the second dummy gate structure to form a first source/drain (S/D) trench between the first dummy gate structure and the second dummy gate structure, and a second S/D trench along a sidewall of the second dummy gate structure away from the first dummy gate structure, wherein bottom surfaces of the first S/D trench and the second S/D trench are above the sacrificial layer;
further etching the first S/D trench such that the bottom surface of the first S/D trench is below a bottom surface of the sacrificial layer, while keeping the second S/D trench unchanged;
replacing the sacrificial layer with a dielectric layer; and
epitaxially growing a first epitaxial feature in the first S/D trench and a second epitaxial feature in the second S/D trench.

17. The method of claim 16, further comprising:
selectively removing the second semiconductor layers;
replacing the first dummy gate structure with a first metal gate structure and replacing the second dummy gate structure a second metal gate structure, wherein the first and second metal gate structures wrap each of the first semiconductor layers;
removing the substrate to expose the first epitaxial feature and the dielectric layer; and
forming a conductive feature contacting the dielectric layer and the first epitaxial feature.

18. The method of claim 16, further comprising:
forming an isolation feature around a lower portion of the semiconductor stack, wherein a top surface of the isolation feature is below a bottom surface of the sacrificial layer;
wherein the removing the substrate includes:
removing a bottom portion of the substrate to expose the isolation feature; and
removing the top portion of the substrate to form an opening in the isolation feature to expose the first epitaxial feature and the dielectric layer.

19. The method of claim 16, wherein the further etching the first S/D trench includes:
forming a patterned photoresist layer over the first dummy gate structure and the second dummy gate structure, wherein the patterned photoresist layer exposes the first S/D trench; and
removing a portion of the sacrificial layer between the first dummy gate structure and the second dummy gate structure through the patterned photoresist layer.

20. The method of claim 19, wherein a width of a removed portion of the sacrificial layer is more than about 10 nm.

* * * * *